US012745379B2

(12) United States Patent
Haga

(10) Patent No.: US 12,745,379 B2
(45) Date of Patent: Sep. 22, 2026

(54) ELECTROMAGNETIC SHIELDING SHEET

(71) Applicant: DAICEL CORPORATION, Osaka (JP)

(72) Inventor: Motoharu Haga, Tokyo (JP)

(73) Assignee: DAICEL CORPORATION, Osaka (JP)

( * ) Notice: Subject to any disclaimer, the term of this patent is extended or adjusted under 35 U.S.C. 154(b) by 132 days.

(21) Appl. No.: 18/724,576

(22) PCT Filed: Dec. 27, 2022

(86) PCT No.: PCT/JP2022/048146
§ 371 (c)(1),
(2) Date: Jun. 26, 2024

(87) PCT Pub. No.: WO2023/127873
PCT Pub. Date: Jul. 6, 2023

(65) Prior Publication Data

US 2025/0063706 A1 Feb. 20, 2025

(30) Foreign Application Priority Data

Dec. 27, 2021 (JP) ................................ 2021-213484

(51) Int. Cl.
*B32B 3/08* (2006.01)
*B32B 3/10* (2006.01)
(Continued)

(52) U.S. Cl.
CPC ............ *H05K 9/0075* (2013.01); *B32B 3/08* (2013.01); *B32B 3/10* (2013.01); *B32B 3/14* (2013.01); *H01Q 1/526* (2013.01); *H01Q 17/007* (2013.01)

(58) Field of Classification Search
CPC .. B32B 3/08; B32B 3/085; B32B 3/10; B32B 3/14; B32B 3/22; H05K 9/0081; H01Q 1/526; H01Q 17/007
See application file for complete search history.

(56) References Cited

U.S. PATENT DOCUMENTS

2019/0300379 A1 10/2019 Kojima et al.

FOREIGN PATENT DOCUMENTS

CN 105514534 A 4/2016
CN 108565558 A 9/2018
(Continued)

OTHER PUBLICATIONS

CN 104541594 (Year: 2015).*
(Continued)

*Primary Examiner* — Elizabeth E Mulvaney
(74) *Attorney, Agent, or Firm* — Birch, Stewart, Kolasch & Birch, LLP

(57) ABSTRACT

A sheet includes an insulating material and a plurality of conductive materials each having a plate shape and having a substantially C-like shape as viewed from above in a thickness direction of the sheet. Each of the plurality of conductive materials is disposed such that a circumferential direction of the substantially C-like shape and a planar direction of the sheet are substantially parallel to each other. At least some of the plurality of conductive materials form a conductive material layered portion in which a plurality of the conductive materials are disposed in the thickness direction of the sheet without being in contact with each other.

18 Claims, 28 Drawing Sheets

(51) Int. Cl.

| | |
|---|---|
| ***B32B 3/14*** | (2006.01) |
| ***H01Q 1/52*** | (2006.01) |
| ***H01Q 17/00*** | (2006.01) |
| ***H05K 9/00*** | (2006.01) |

(56) References Cited

FOREIGN PATENT DOCUMENTS

| | | | |
|---|---|---|---|
| CN | 110739549 | A | 1/2020 |
| JP | 10-223467 | A | 8/1998 |
| JP | 2005-252141 | A | 9/2005 |
| JP | 2011-86930 | A | 4/2011 |
| JP | 2019-67997 | A | 4/2019 |
| WO | WO2017/212997 | A1 | 12/2017 |

OTHER PUBLICATIONS

JP 2005-252141 (Year: 2005).*

International Search Report for International Application No. PCT/JP2022/048146, dated Apr. 4, 2023, with an English translation.

Written Opinion of the International Searching Authority for International Application No. PCT/JP2022/048146, dated Apr. 4, 2023, with an English translation.

Extended European Search Report for European Application No. 22916095.7, dated Oct. 24, 2025.

* cited by examiner

ELECTROMAGNETIC SHIELDING SHEET

TECHNICAL FIELD

The present invention relates to a sheet.

BACKGROUND ART

Communication devices such as cell phones and smartphones can perform wireless communication using electromagnetic waves. The frequency band of the electromagnetic waves used is widening with advancement of technology in this field. Specifically, a wireless communication system conforming to the IMT-Advanced standard defined by the International Telecommunication Union (ITU) has been defined. The frequency band, which has been the 800 MHz band for the first-generation mobile communication system (1G), has been widened to the 3 GHz band in the fourth-generation mobile communication system (4G). The frequency band has been further widened to the 28 GHz band to achieve higher speed, higher capacity, lower latency, and more connections for the fifth-generation mobile communication system (5G) currently adopted. Currently, development has been underway for a next-generation communication system, namely, the sixth-generation mobile communication system (6G) using a frequency band of 100 GHz or higher. While the use of electromagnetic waves in the high frequency band is attracting attention, the higher frequency of electromagnetic waves used can easily cause problems such as malfunctions of electronic device, communication failures, information leakage, and health problems, making electromagnetic wave noise control (electromagnetic compatibility (EMC)) necessary. Specifically, there is a need to develop new materials that can suppress both emission electromagnetic interference (EMI; aggressor) and immunity electromagnetic susceptibility (EMS; victim). One way to solve this problem is to use an electromagnetic wave control material that can reduce the influence of electromagnetic waves from the surroundings. There are various forms of the electromagnetic wave control material such as, for example, a package/module of a semiconductor, an enclosure of an electric/electronic device, an adhesive material for a semiconductor mounting substrate or a cable, wallpaper of a building such as a server room, or clothing such as an apron for protecting a human body.

Various types of electromagnetic wave control materials exist and have been extensively studied. For example, there are reflective materials that reflect electromagnetic waves by using metal plates having a large area, and absorptive materials that absorb electromagnetic waves by using materials obtained by mixing conductive materials with organic materials such as resin or rubber.

For example, a report as a result of such study related to absorptive materials indicates that it is effective to use a material having a structure with a size one order smaller than the wavelength of the electromagnetic waves to be blocked. To form such a structure, development of a material containing small fillers has been underway.

Patent Document 1 discloses a sheet exhibiting excellent electromagnetic wave shielding properties for a frequency of 1 GHz. The sheet is a composite of an insulating layer and a conductive layer containing flaky silver powder having a predetermined particle size and bulk density in a binder resin. Patent Document 2 discloses a sheet that can block electromagnetic waves in a frequency band from 1 MHz to 1 GHz. The sheet is a composite containing single crystal ferrite particles having a predetermined average particle size and a spherical particle shape in a binder resin. Patent Document 3 discloses a sheet that can block electromagnetic waves in a frequency band from 18.0 to 26.5 GHz. The sheet is a composite containing a predetermined amount of nickel nanowire or more in a binder resin. The sheet features excellent handleability and flexibility.

PRIOR ART DOCUMENT

Patent Document

[Patent Document 1] JP 2011-86930 A
[Patent Document 2] WO 2017/212997
[Patent Document 3] JP 2019-67997 A

SUMMARY OF THE INVENTION

Problems to be Solved by the Invention

For sheets made of reflective materials, the use of metal plates having large areas has caused a problem of an increase in product weight. On the other hand, for sheets made of absorptive materials, as disclosed in Patent Documents 1 to 3 described above, a problem arises that the sheets cannot block electromagnetic waves in a frequency band used in the next-generation wireless communication system, which is one order higher than the frequency bands that have been used in wireless communication systems adopted so far. In view of this, development of a high-performance sheet that can block the electromagnetic waves in such frequency bands as related to these problems is in demand.

Thus, an object of the present invention is to provide a sheet that can be reduced in weight and shield electromagnetic waves in a high frequency band.

Means for Solving the Problems

Through diligent study, the present inventor has discovered that the problems described above can be solved by arranging a conductive material having a specific shape in a resin in a specific aspect, and thus has arrived at the present invention.

That is, the present invention provides the following characteristics.

[1]A sheet including an insulating material, and a plurality of conductive materials each having a plate shape and having a substantially C-like shape as viewed from above in a thickness direction of the sheet, in which each of the plurality of conductive materials is disposed such that a circumferential direction of the substantially C-like shape and a planar direction of the sheet are substantially parallel to each other, and at least some of the plurality of conductive materials form a conductive material layered portion in which a plurality of the conductive materials are disposed in the thickness direction of the sheet without being in contact with each other.

[2] The sheet according to [1], in which a plurality of the conductive material layered portions are disposed in the planar direction of the sheet.

[3] The sheet according to [2], in which the number of the plurality of conductive material layered portions as viewed from above in the thickness direction of the sheet with respect to an area of the sheet as viewed from above in the thickness direction of the sheet is from 1 portion/mm$^2$ or more and 30 portions/mm$^2$ or less.

[4] The sheet according to [2] or [3], in which the plurality of conductive material layered portions are disposed in the planar direction of the sheet, forming a plurality of rows formed at equal intervals and extending in a certain direction, each of the plurality of conductive material layered portions is disposed with the conductive materials constituting the conductive material layered portion substantially parallel to the planar direction of the sheet, thereby forming a plurality of layers in the planar direction including a plurality of the conductive materials on the same plane, and each layer of the plurality of layers in the planar direction independently includes a specific region A satisfying the following Condition 1:

Condition 1: In each of the plurality of rows of the conductive materials formed extending in the certain direction in the specific region A, given the conductive material at one of two ends of the row as a reference, the conductive materials are disposed with angles respectively formed between an opening direction of the substantially C-like shape of the conductive materials and an opening direction of the substantially C-like shape of the conductive material serving as the reference as viewed from above in the thickness direction of the sheet increasing in increments of $\theta_1$ toward the conductive material at the other end; and the $\theta_1$ satisfies $0° < \theta_1 < 360°$ with a tolerance of less than $\theta_1/2$.

[5] The sheet according to [4], in which the specific region A further satisfies the following Condition 3A:

Condition 3A: The $\theta_1$ satisfies "$(360°/\theta_1) = n$ (where n is a natural number other than 1)".

[6] The sheet according to [5], in which the specific region A further satisfies the following Condition 4A:

Condition 4A: The number of the conductive materials included in each of the plurality of rows of the conductive materials formed extending in the certain direction is $360°/\theta_1$.

[7] The sheet according to [5] or [6], in which the plurality of conductive material layered portions are further disposed in the planar direction of the sheet, forming a plurality of rows formed at equal intervals and extending in a direction orthogonal to the certain direction, and in the specific region A, each layer of the plurality of layers in the planar direction independently satisfies the following Condition 2:

Condition 2: In each of the plurality of rows of the conductive materials formed extending in the direction orthogonal to the certain direction in the specific region A, given the conductive material at one of the two ends of the row as a reference conductive material, the conductive materials are disposed with angles respectively formed between the opening direction of the substantially C-like shape of the conductive materials and the opening direction of the substantially C-like shape of the reference conductive material as viewed from above in the thickness direction of the sheet increasing in increments of $\theta_1'$ toward the conductive material at the other end; and the $\theta_1'$ satisfies $0° < \theta_1' < 360°$ with a tolerance of less than $\theta_1'/2$.

[8] The sheet according to [7], in which the specific region A further satisfies the following Condition 3B:

Condition 3B: The $\theta_1'$ satisfies "$(360°/\theta_1') = n$ (where n is a natural number other than 1)".

[9] The sheet according to [8], in which the specific region A further satisfies the following Condition 4B:

Condition 4B: The number of the conductive materials included in each of the plurality of rows of the conductive materials formed extending in the direction orthogonal to the certain direction is $360°/\theta_1'$.

[10] The sheet according to any one of [4] to [6], in which the plurality of conductive material layered portions are further disposed in the planar direction of the sheet, forming a plurality of rows formed at equal intervals and extending in a direction orthogonal to the certain direction, and in the specific region A, each layer of the plurality of layers in the planar direction independently satisfies the following Condition 2':

Condition 2': In each of the plurality of rows of the conductive materials formed in the direction orthogonal to the certain direction in the specific region A, the conductive materials are disposed with the opening directions of the substantially C-like shapes of all of the conductive materials constituting each of the plurality of rows as viewed from above in the thickness direction of the sheet being the same.

[11] The sheet according to [2] or [3], in which the plurality of conductive material layered portions are disposed in the planar direction of the sheet at equal intervals in a certain direction and at equal intervals in a direction orthogonal to the certain direction, each of the plurality of conductive material layered portions is disposed with the conductive materials constituting the conductive material layered portion substantially parallel to the planar direction of the sheet, thereby forming a plurality of layers in the planar direction including a plurality of the conductive materials on the same plane, and each layer of the plurality of layers in the planar direction independently includes a specific region B satisfying the following Condition 5:

Condition 5: Opening directions of the substantially C-like shapes of all of the conductive materials in the specific region B as viewed from above in the thickness direction of the sheet are the same.

[12] The sheet according to any one of [1] to [11], in which the one or more conductive material layered portions include at least one specific conductive material layered portion in which opening directions of the substantially C-like shapes of the conductive materials constituting the conductive material layered portion, as viewed from above in the thickness direction of the sheet, differ from each other at least in part.

[13] The sheet according to [12], in which the at least one specific conductive material layered portion includes at least one specific conductive material layered portion in which the opening directions of the substantially C-like shapes of, among the conductive materials constituting the specific conductive material layered portion, two conductive materials disposed on an uppermost surface side and a lowermost surface side of the sheet are the same.

[14] The sheet according to any one of [1] to [13], in which the at least one specific conductive material layered portion includes at least one specific conductive material layered portion satisfying the following Condition 6:

Condition 6: In the at least one specific conductive material layered portion, given one of two conductive materials disposed on an uppermost surface side and a lowermost surface side of the sheet as a reference conductive material and $\theta_2$ as an angle formed between an opening direction of the substantially C-like shape of the conductive materials and an opening direction of the substantially C-like shape of the reference conductive material as viewed from above in the thickness direction of the sheet, the opening direction of the substantially C-like shape of the conductive materials, other than the reference conductive material, included in the specific conductive material layered portion is represented by $m\theta_2$; the m is a natural number; the $\theta_2$ satisfies $0° < \theta_2 < 360°$ with a tolerance of less than $\theta_2/2$.

[15] The sheet according to [14], in which the at least one specific conductive material layered portion includes k (where k is a natural number) conductive materials, each with the m being a natural number of d or less satisfying the following Condition 7 and the opening direction of the substantially C-like shape satisfying $m\theta_2$:

Condition 7: The d satisfies "$(360°/\theta_2)=d$ (where d is a natural number other than 1)".

[16] The sheet according to any one of [1] to [11], in which the one or more conductive material layered portions includes at least one conductive material layered portion in which opening directions of the substantially C-like shapes of all of the conductive materials constituting the conductive material layered portion, as viewed from above in the thickness direction of the sheet, are the same.

[17] The sheet according to any one of [1] to [16], in which an average value of lengths of largest possible line segments in a plane of each of the plurality of conductive materials in the circumferential direction is from 1 μm or more and 2000 μm or less.

[18] The sheet according to any one of [1] to [17], in which an average value of distances between the plurality of conductive materials in the thickness direction of the sheet is from 1 μm or more and 3000 μm or less.

[19] The sheet according to any one of [1] to [18], in which the one or more conductive material layered portions include at least one conductive material layered portion including a conductive material having a pillar shape that connects each of the conductive materials constituting the conductive material layered portion to another conductive material disposed adjacently in the thickness direction.

[20] The sheet according to any one of [1] to [19], in which the conductive materials constituting each of the one or more conductive material layered portions are not electrically continuous with each other.

[21] The sheet according to any one of [1] to [20], in which the sheet is an electromagnetic wave shielding sheet.

Effect of the Invention

According to the present invention, it is possible to provide a sheet that can be reduced in weight and can block electromagnetic waves in a high frequency band.

MODE FOR CARRYING OUT THE INVENTION

Figure 1:
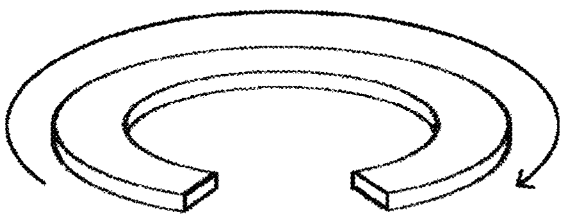
FIG. 1 is an external perspective view according to one aspect of a conductive material having a substantially C-like shape.

Hereinafter, although embodiments according to the present invention will be described in detail, each of the configurations, combinations thereof, and the like in each embodiment are an example, and various additions, omissions, substitutions, and other changes may be made as appropriate without departing from the spirit of the present invention. The present disclosure is not limited by the embodiments and is limited only by the claims.

In the present disclosure, a numerical range expressed by "to" implies a range including the numerical values described before and after "to" as the lower limit value and the upper limit value. Specifically, "A to B" implies a value that is A or more and B or less.

Further, although a plurality of embodiments are described in the present disclosure, various conditions in each embodiment can be applied to each other within an applicable range.

In addition, in the present disclosure, "a plurality of" implies "two or more".

The dimensions, materials, shapes, relative arrangements, and the like of constituent elements described in the present embodiment are examples. Further, although the present embodiment will be described with reference to the drawings as appropriate, dimensions and the like in the drawings are also examples.

<Configuration of Sheet>

A sheet according to an embodiment of the present disclosure (hereinafter also simply referred to as "sheet") is a sheet including an insulating material, and a plurality of conductive materials each having a plate shape and having a substantially C-like shape as viewed from above in a thickness direction of the sheet. Each of the plurality of conductive materials is disposed such that a circumferential direction of the substantially C-like shape and a planar direction of the sheet are substantially parallel to each other. At least some of the plurality of conductive materials form a conductive material layered portion in which a plurality of the conductive materials are disposed in the thickness direction of the sheet without being in contact with each other.

The present inventor focused on a conductive material having a substantially C-like shape capable of controlling polarization as a structure capable of shielding strong electromagnetic waves in a terahertz range. When incident electromagnetic waves that are linearly polarized waves enter a material having a C shape, the polarized waves are converted into and emitted as elliptically polarized waves. The material having a substantially C-like shape can thus be used for controlling polarization. However, in the present embodiment, attention is paid not to the control of polarization but to the magnitude of absorption of electromagnetic waves by the use of a plurality of the substantially C-like shapes.

Furthermore, the present inventor focused on the fact that the substantially C-like shape described above can be regarded as an LC resonance circuit. In this case, a look at the transmittance of the material having a substantially C-like shape indicates that the electromagnetic wave absorption effect through LC resonance can be achieved with C being the capacitance of a gap in the substantially C-like shape and L being the inductance of the substantially C-like shape itself. Thus, an increase in the number of substantially C-like shapes used is expected to lead to an enhancement of this electromagnetic wave absorption effect, and thus the present invention was completed.

Furthermore, the present inventor found that, by selecting the conditions of the conductive materials as appropriate, it is possible to not only increase the frequency band of the electromagnetic waves that can be shielded, but also control the frequency that can be shielded and narrow or widen the width of the frequency band that can be shielded. The width of the frequency band that can be shielded may need to be wide or narrow, depending on the application.

Further, reflection of electromagnetic waves occurs when there is a difference in impedance at an interface. In the sheet according to the embodiment described above, because a plurality of the conductive materials having a substantially C-like shape are layered in the thickness direction of the sheet and a plurality of interfaces (surfaces of the conductive materials) that cause a difference in impedance are present, reflection of the electromagnetic waves is repeated and the absorption described above is efficiently performed.

Further, in the sheet according to the present embodiment, it is easy to reduce the mass and lighten the weight of the product as compared to a sheet using an electromagnetic wave reflective material in the related art that uses a metal plate having a large area.

Unless particularly noted, in the present disclosure, a description is given assuming that the direction of external electromagnetic waves is a direction orthogonal to the direction of the sheet flat surface.

[Conductive Material]

FIG. 1 illustrates an example of a plurality of conductive materials, each having a plate shape and a substantially C-like shape as viewed from above in the thickness direction of the sheet. The conductive materials illustrated in FIG. 1 are perspective views of the conductive materials, the direction of the arrow in the drawing is a circumferential direction, and the orientation of the arrow is a clockwise direction.

Figure 2:
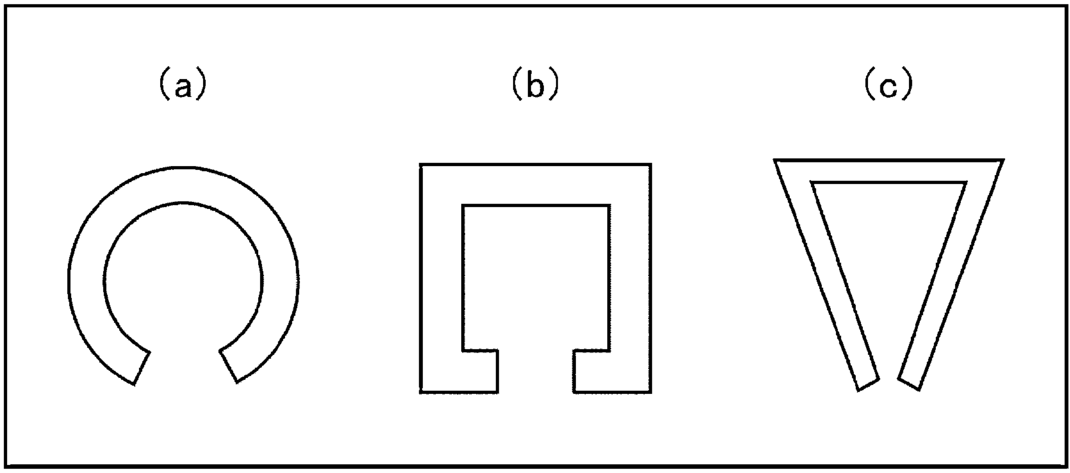
FIG. 2 is a view for explaining aspects of the substantially C-like shape.

The shape of the conductive material as viewed from above in the thickness direction of the sheet is not particularly limited as long as the shape is a substantially C-like shape. The substantially C-like shape may be the shape of a circular ring with portion of the ring missing as illustrated in FIG. 2, (a). Alternatively, the shape of the ring in FIG. 2, (a) may be a polygonal shape such as a triangle or a quadrilateral, such as illustrated in FIG. 2, (b) or FIG. 2, (c), or the shape of this ring may be any desired shape. However, from the viewpoint of the likelihood of achieving stable effects, preferably the shape is a circular or polygonal ring ("ring" may be replaced with "annular shape") with a portion of the ring missing and, from the viewpoint of availability and ease of manufacture, more preferably, the shape is a circular ring with a portion of the ring missing. Further, the shape of an outer periphery and the shape of an inner periphery constituting the substantially C-like shape may be the same as illustrated in FIGS. 2, (a) to 2, (c), but may be different. For example, the shape of the outer periphery may be quadrangular and the shape of the inner periphery may be circular. From the viewpoint of availability, however, the shapes are preferably the same.

Note that some of the plurality of conductive materials may be exposed.

Hereinafter, the conductive material will be described in detail under the assumption that the substantially C-like shape is a shape in which a portion of a circular ring is missing, as illustrated in FIG. 2, (a). However, the conditions in the description are similarly applied to other shapes as well, within an applicable range.

In the present disclosure, the term "average" used as a parameter of the conductive material refers to an average value of the plurality of conductive materials present.

Further, in the present disclosure, the term "surface of the conductive material in the circumferential direction" can be paraphrased as the planar direction of the conductive material having a plate shape.

The type of material constituting the conductive material is not particularly limited as long as the material has conductivity. Examples of the material include a carbon material such as carbon, as well as copper (Cu), aluminum (Al), iron (Fe), gold (Au), silver (Ag), platinum (Pt), magnesium (Mg), zinc (Zn), tungsten (W), titanium (Ti), nickel (Ni), or manganese (Mn), an alloy that is a combination of these metal elements, or an oxide of these metal elements or alloys thereof, or a metal-containing compound such as a halide or a sulfide. In particular, preferably, Cu or Ag is used for the sake of durability of the sheet since these are elements that have an elastic modulus suitable for processing and, when mixed in resin or the like, achieve a high corrosion resistance and a small coefficient of linear expansion.

The average value of thicknesses of the conductive materials having plate shapes is not particularly limited. However, from the viewpoint of achieving the ability to selectively absorb a frequency width in a 100 GHz frequency band, the average value is typically 0.01 μm or more, preferably 0.1 μm or more, and more preferably 0.2 μm or more, and typically 100 μm or less, preferably 80 μm or less, more preferably 50 μm or less, and still more preferably 30 μm or less.

An average value of lengths Do of the largest possible line segments in a plane of the conductive materials in the circumferential direction is not particularly limited. However, from the viewpoint of achieving the ability to selectively absorb peak frequencies in the 100 GHz frequency band, the average length Do is typically 1 μm or more, preferably 10 μm or more, and more preferably 50 μm or more, and typically 2000 μm or less, preferably 1000 μm or less, more preferably 800 μm or less.

The average value of linear widths W of the substantially C-like shapes in the plane of each conductive material in the circumferential direction is not particularly limited. However, from the viewpoint of forming the substantially C-like shapes, the average value is typically 0.1 μm or more, preferably 1 μm or more, and more preferably 10 μm or more, and is typically 1000 μm or less, preferably 500 μm or less, and more preferably 250 μm or less.

The average value of opening angles θc of the substantially C-like shapes of the conductive materials is not particularly limited. However, the average value is typically 1800 or less, preferably 135° or less, and more preferably 90° or less from the viewpoint of improving the ability to absorb electromagnetic waves, and is typically 1° or more, preferably 4° or more, and more preferably 7° or more from the viewpoint of maintaining an open ring portion for generating resonance. The opening angle θc is an angle formed by two lines connecting a center of the substantially C-like shape and respective center portions of closing lines described below.

Figure 3:
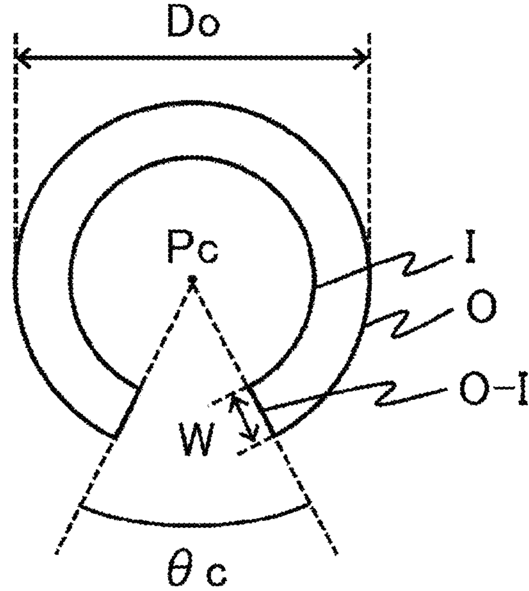
FIG. 3 is a view for explaining parameters according to a form of the substantially C-like shape.

FIG. 3 illustrates Do, W, and θc in a substantially C-like shape that is a circular ring shape with a portion of the ring missing. A point Pc in FIG. 3 is a center point of the substantially C-like shape. Further, in the present disclosure, a line O, a line I, and a line O-I illustrated in FIG. 3 are respectively referred to as an outer edge, an inner edge, and the closing line of the substantially C-like shape. When a boundary between the inner edge and the closing line or a boundary between the outer edge and the closing line is unclear in a target substantially C-like shape, the boundary can be determined by replacing an end portion of the target substantially C-like shape with an end portion having the same shape as the end portion of the substantially C-like shape illustrated in FIG. 3 under the condition that an area of the conductive material in the planar direction does not change.

The conductive material is disposed with the circumferential direction of the substantially C-like shape substantially parallel to the planar direction of the sheet. With such an arrangement, an electric field is generated in a direction orthogonal to the electromagnetic waves, and the generated electric field and the substantially C-like shape are on the same plane, thereby causing resonance to occur within the substantially C-like shape or through the ring opening. This resonance is classified into half-wavelength resonance and LC resonance, and the effect of absorption and/or reflection of the electromagnetic waves is readily achieved.

Figure 4:
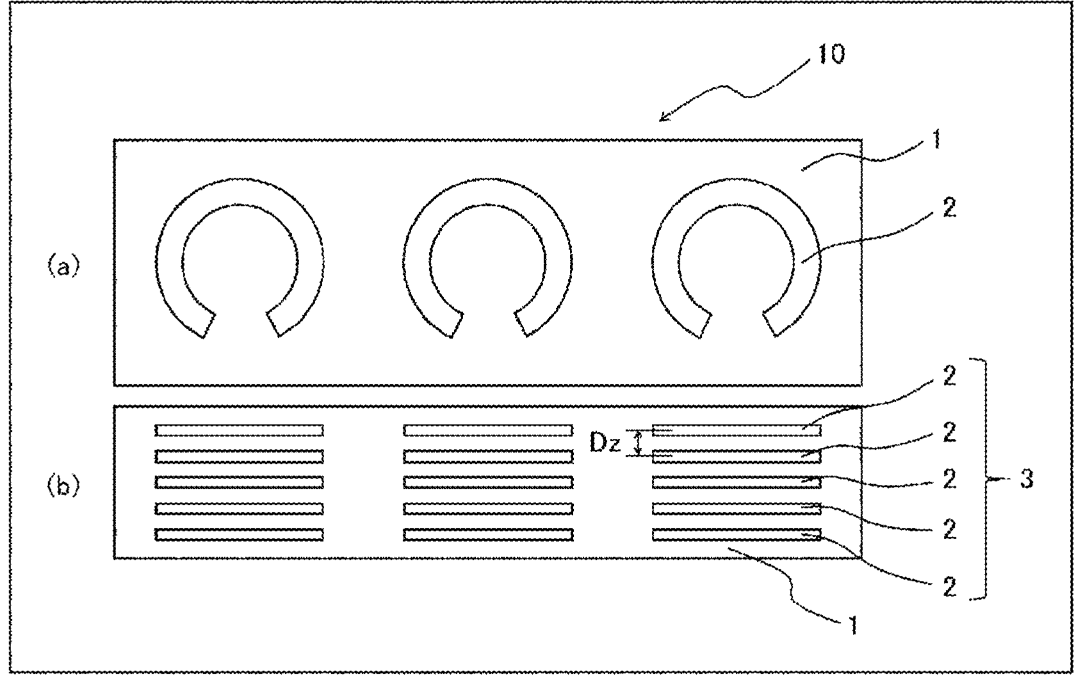
FIG. 4 is a plan view and a front view according to an aspect of a sheet.
Figure 8:
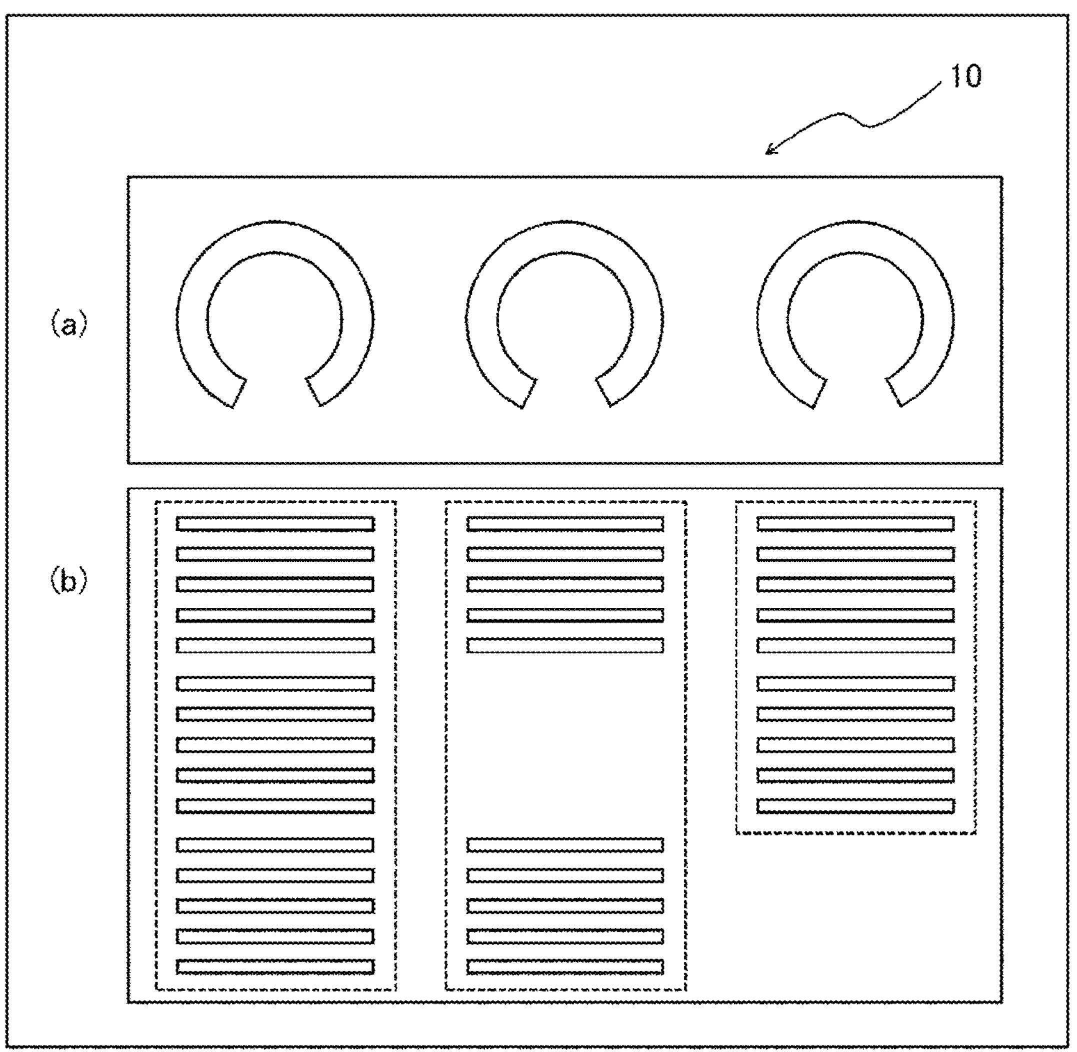
FIG. 8 is a plan view and a front view according to an aspect of the sheet.

From the viewpoint of improving the ability to reflect and/or absorb electromagnetic waves (hereinafter, also referred to as "reflection/absorption performance"), at least some of the plurality of conductive materials form a conductive material layered portion in which a plurality of the conductive materials are disposed in the thickness direction of the sheet without being in contact with each other. FIG. 4 illustrates an example of a sheet 10 according to the present embodiment. The sheet 10 includes three conductive material layered portions 3 composed of a base material 1 including a non-conductive material such as a resin, and conductive materials 2 included in the base material 1. FIG. 4 illustrates an example of the conductive material layered portions. FIGS. 4, (a) and 4(*b*) are a plan view and a front view of the conductive material layered portions, respectively (in the front view, illustrations of the openings of the substantially C-like shapes are omitted; in the front views in the other drawings as well, illustrations thereof are omitted). Dz in FIG. 4 represents a distance between the conductive materials in the thickness direction. The relationship between the plan view and the front view is the same for FIGS. 8, (a) and 8, (b) and FIGS. 10, (a) and 10, (b).

The number of the conductive materials constituting one conductive material layered portion is not particularly limited. However, the number is typically 1 or more, preferably 2 or more, more preferably 4 or more, still more preferably 8 or more, and particularly preferably 10 or more from the viewpoint that the reflection/absorption performance can be improved as the number of the conductive materials layered is increased, and the number is typically 80 or less, preferably 64 or less, more preferably 48 or less, still more preferably 32 or less, and particularly preferably 24 or less from the viewpoint of providing flexibility while securing sufficient reflection/absorption performance.

Further, opening directions of the substantially C-like shapes of the conductive materials constituting one conductive material layered portion are not particularly limited, and the opening directions of the substantially C-like shapes of all conductive materials may be the same (including substantially the same) direction, or the opening directions of the substantially C-like shapes of all conductive materials may be desired directions.

In the present disclosure, when the term "the same" is used with respect to a position or an angle, the term also includes "substantially the same".

The average value of the distances Dz between the conductive materials constituting the conductive material layered portion (distance between the conductive materials in the thickness direction of the sheet) is not particularly limited. However, the distance is typically 1 μm or more, preferably 5 μm or more, more preferably 10 μm or more, still more preferably 25 μm or more, and particularly preferably 50 μm or more from the viewpoint of improving the reflection/absorption performance. When the sheet is mounted in an interior of a smartphone, a tablet, or the like, the thickness of the sheet is desirably reduced, and thus the average value is typically 3000 μm or less, preferably 2000 μm or less, more preferably 1000 μm or less, still more preferably 300 μm or less, and particularly preferably 100 μm or less.

Figure 5:
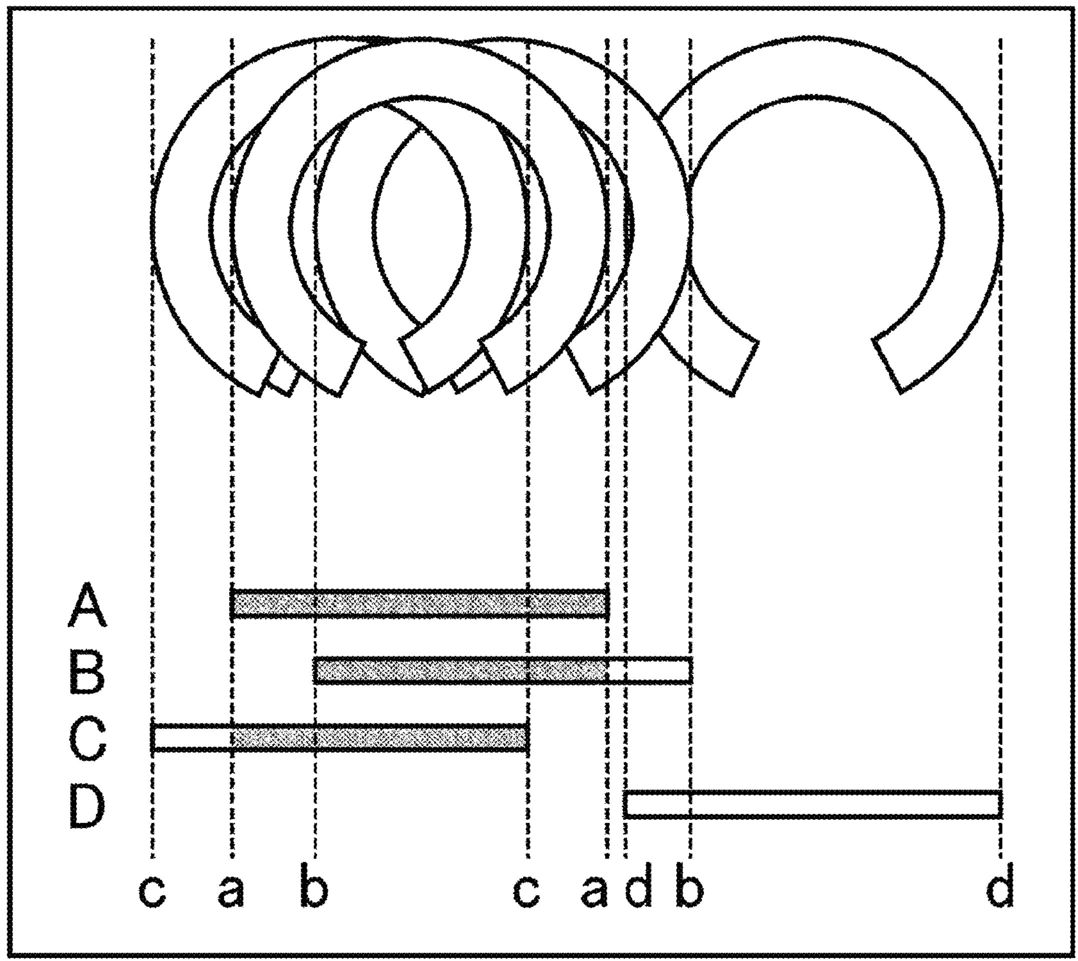
FIG. 5 is a view for explaining the conductive materials that can constitute a conductive material layered portion.

An arrangement of the conductive materials constituting one conductive material layered portion may be in complete alignment in the thickness direction of the sheet as illustrated in FIG. 4, but may not be aligned (may be shifted) as illustrated in FIG. 5 (and thus the conductive material of D in FIG. 5 does not constitute the conductive material layered portion as described below). However, from the viewpoint of improving reflection performance and absorption performance, alignment is preferred.

A determination of whether a target conductive material constitutes the conductive material layered portion will now be described. A topmost or a bottommost conductive material (hereinafter also referred to as an "endmost conductive material") that can constitute the conductive material layered portion is identified, and each conductive material including a portion overlapping the endmost conductive material in the thickness direction of the sheet as viewed from a side surface side of the sheet is regarded as a conductive material layered portion included in the conductive material layered portion including the endmost conductive material. In FIG. 5, a, b, c, and d are end portions of conductive materials A, B, C, and D in the planar direction as viewed from the side surface side of the sheet, respectively. Therefore, in FIG. 5, when the conductive material A is the endmost conductive material, both the conductive materials B and C include a portion (shaded portion in FIG. 5) overlapping the endmost conductive material in the thickness direction of the sheet as viewed from the side surface side of the sheet, and thus are conductive materials included in the conductive material layered portion including the conductive material A as the endmost conductive material. On the other hand, the conductive material D in FIG. 5 does not include a portion overlapping the endmost conductive material in the thickness direction of the sheet as viewed from the side surface side of the sheet, and thus is not a conductive material included in the conductive material layered portion including the conductive material A as the endmost conductive material. When the conductive material layered portion is thus defined, the respective conductive materials constituting the conductive material layered portion overlap each other in the thickness direction of the sheet as viewed from the side surface of the sheet. Therefore, even if the conductive materials are not completely aligned, the electromagnetic waves are absorbed by each layer, Furthermore, when reflection occurs, the electromagnetic waves are absorbed by the layer in front, making it possible to shield the electromagnetic waves as a result.

Figure 7:
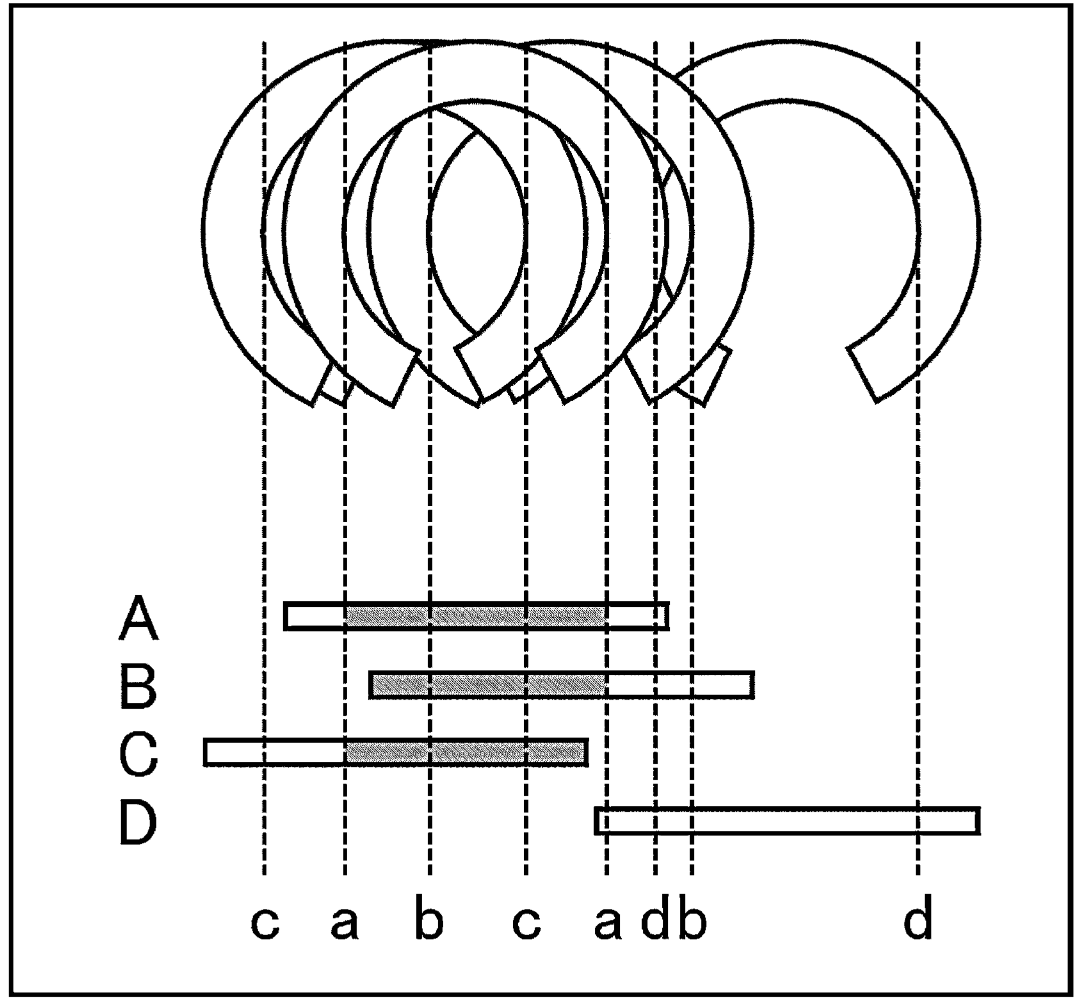
FIG. 7 is a view for explaining the conductive materials that can constitute the conductive material layered portion.

Whether the target conductive material is included in the conductive material layered portion can be determined by the method described above with reference to FIG. 5, but is preferably determined by the method described below with reference to FIG. 7.

Figure 6:
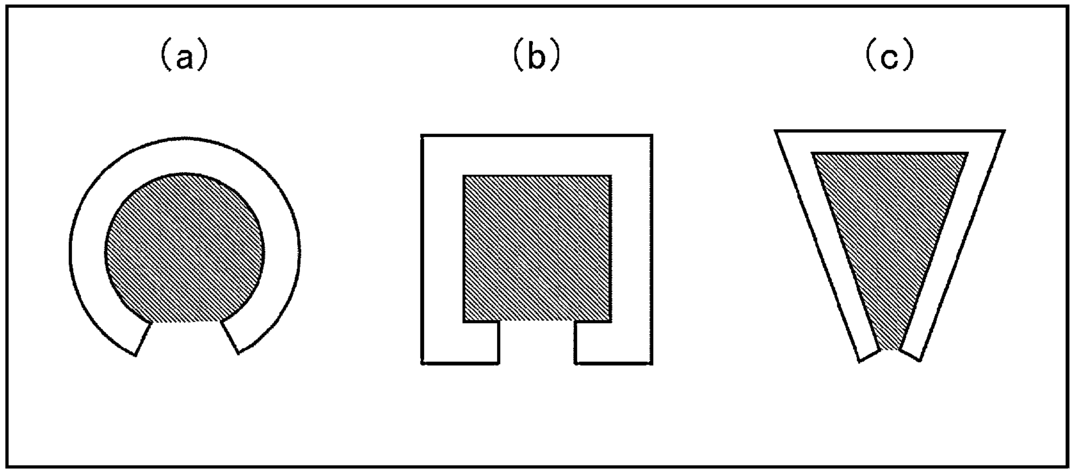
FIG. 6 is a view for explaining a space portion of the conductive material.

The topmost or the bottommost conductive material (hereinafter also referred to as an "endmost conductive material") that can constitute the conductive material layered portion is identified, and the conductive materials including, in a space portion thereof, a portion overlapping a space portion of the endmost conductive material in the thickness direction of the sheet as viewed from the side surface side of the sheet is regarded as a conductive material layered portion included in the conductive material layered portion that includes the endmost conductive material. The space portion of the conductive material is a portion formed by an inner edge of the conductive material and a line connecting end portions of lines constituting the inner edge, and is, for example, each shaded portion illustrated in FIGS. 6, (a) to 6, (c). Further, a, b, c, and d in FIG. 7 are the end portions of the space portions of the conductive materials A, B, C, and D in the planar direction as viewed from the side surface side of the sheet, respectively. Therefore, with reference to FIG. 7, when the conductive material A is the endmost conductive material, both the conductive materials B and C include a portion (shaded portion in FIG. 7) in which the space portions overlap the endmost conductive material in the thickness direction of the sheet as viewed from the side surface side of the sheet, and thus are conductive materials included in the conductive material layered portion including the conductive material A as the endmost conductive material. On the other hand, the conductive material D in FIG. 7 does not include a portion overlapping the endmost conductive material in the thickness direction of the sheet as viewed from the side surface side of the sheet, and thus is not a conductive material included in the conductive material layered portion including the conductive material A as the endmost conductive material. When the conductive material layered portion is defined as described above, the conductive materials constituting the conductive material layered portion include portions overlapping in the thickness direction of the sheet as viewed from the side surface side of the sheet, and thus the electromagnetic wave reflection/absorption effect by the substantially C-like shapes depends greatly on the space portions of the substantially C-like shapes. Therefore, from the viewpoint of achieving the effect of the invention, the space portions of the conductive materials preferably overlap. The overlapping of the space portions is preferable in that the electromagnetic waves reflected by the conductive materials having substantially C-like shapes in second and subsequent layers can be absorbed by the layer in front.

In both of the two definitions of the conductive material layered portion described above, the conductive materials that can be included in one conductive material layered portion according to each definition are all treated as constituting one conductive material layered portion, regardless of the distance between the conductive materials. That is, in the sheet illustrated in FIG. 8, all conductive materials in each region surrounded by a dashed line are treated as constituting one conductive material layered portion.

The degree of positional shift of the conductive materials included in the conductive material layered portion relative to the thickness direction of the sheet as viewed from the side surface side of the sheet is not particularly limited. However, as viewed from above in the thickness direction of the sheet, given 1 as the length Do of the largest possible line segment in the plane of the conductive materials in the circumferential direction, 70% or more of the conductive materials constituting one conductive material layered portion may be disposed inside a virtual circle having a diameter length of 1.2. With such an arrangement, it is possible to streamline the manufacture of the sheet. Specifically, it is possible to easily control positional shifts in the conductive materials. Further, when the conductive materials are observed under similar conditions, 70% or more of the conductive materials constituting one conductive material layered portion need not fall inside the virtual circle having the diameter length of 1.2, but may be disposed inside a virtual circle having a diameter length of 2. With such an arrangement, the electromagnetic wave absorption performance can be improved.

Of the conductive materials constituting one conductive material layered portion, the number of conductive materials satisfying the conditions described above may be 70% or more as described above, but is preferably 80% or more, more preferably 90% or more, still more preferably 95% or more, and particularly preferably 100%, and may be less than 100%.

A plurality of the conductive material layered portions may be disposed as described above. Specifically, a plurality of the conductive material layered portions may be disposed in the planar direction of the sheet.

When a plurality of the conductive material layered portions are disposed, the number of conductive material layered portions as viewed from above in the thickness direction of the sheet with respect to an area of the sheet as viewed from above in the thickness direction of the sheet is not particularly limited; however, from the viewpoint of easily controlling the frequencies of the electromagnetic waves to be controlled, preferably, the number may be 1 portion/mm$^2$ or more, 3 portions/mm$^2$ or more, 5 portions/mm$^2$ or more, 7 portions/mm$^2$ or more, or 10 portions/mm$^2$ or more, and 30 portions/mm$^2$ or less, 25 portions/mm$^2$ or less, 20 portions/mm$^2$ or less, 15 portions/mm$^2$ or less, or 13 portions/mm$^2$ or less.

Specifically, the number described above can be determined by the wavelength of the electromagnetic waves to be shielded (also referred to simply as "wavelength" in this paragraph), and is typically 1 portion/(wavelength)$^2$ or more, preferably 3 portions/(wavelength)$^2$ or more, more preferably 5 portions/(wavelength)$^2$ or more, and still more preferably 7 portions/(wavelength)$^2$ or more, and is typically 30 portions/(wavelength)$^2$ or less, preferably 20 portions/(wavelength)$^2$ or less, more preferably 15 portions/(wavelength)$^2$ or less, and still more preferably 10 portions/(wavelength)$^2$.

For example, when the frequency of the electromagnetic waves to be shielded is 325 GHz, the number is preferably from 5 portions/mm$^2$ or more and 15 portions/mm$^2$ or less, more preferably 7 portions/mm$^2$ or more and 13 portions/mm$^2$ or less, and particularly preferably 9 portions/mm$^2$ or more and 11 portions/mm$^2$ or less.

Further, when the frequency of electromagnetic waves to be shielded is 190 GHz, the number is preferably from 1 portion/mm$^2$ or more and 10 portions/mm$^2$ or less, more preferably 2 portions/mm$^2$ or more and 8 portions/mm$^2$ or less, and particularly preferably 3 portions/mm$^2$ or more and 5 portions/mm$^2$ or less.

When the frequency of electromagnetic waves to be shielded is 100 GHz, the number is preferably from 1 portions/mm$^2$ or more and 5 portions/mm$^2$ or less, more preferably 1 portions/mm$^2$ or more and 3 portions/mm$^2$ or less, and particularly preferably 1 portion/mm$^2$.

Figure 9:
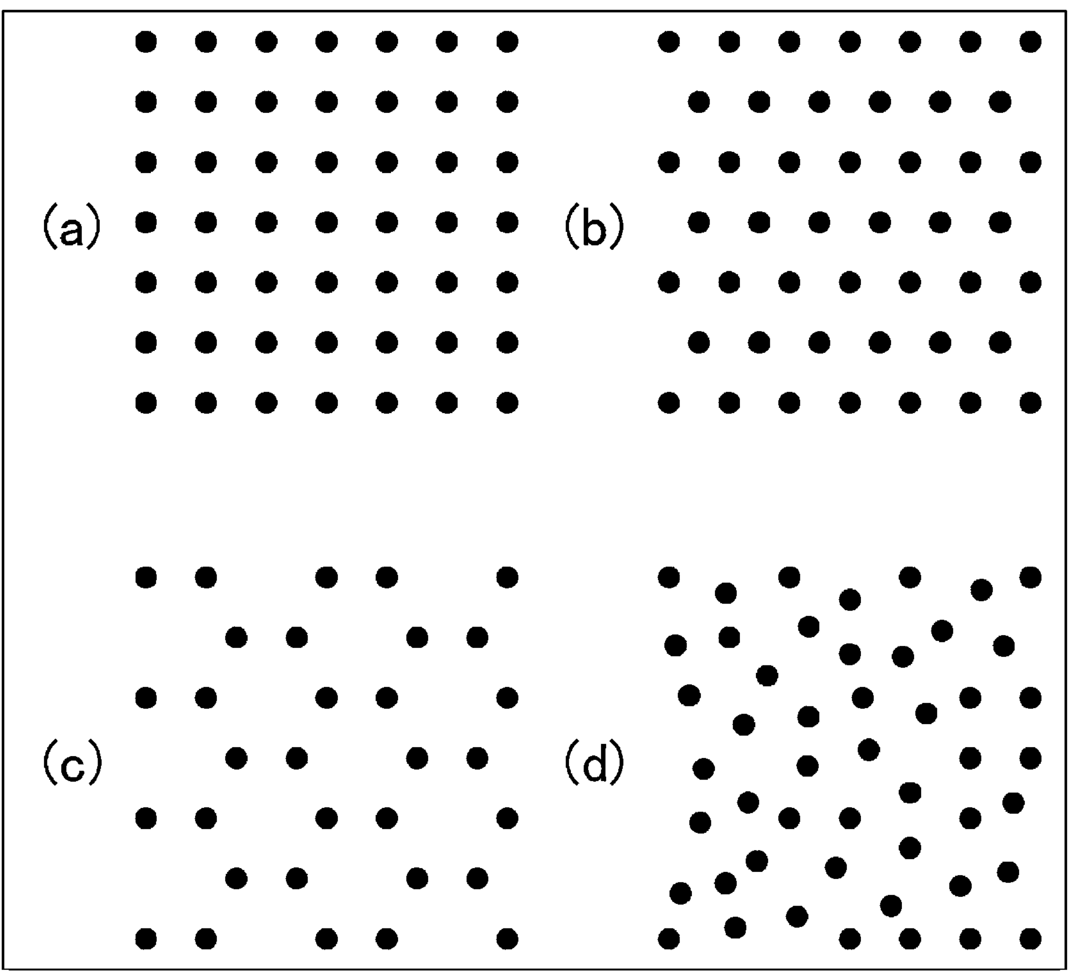
FIG. 9 is a plan view and a front view according to an aspect of the sheet.
Figure 10:
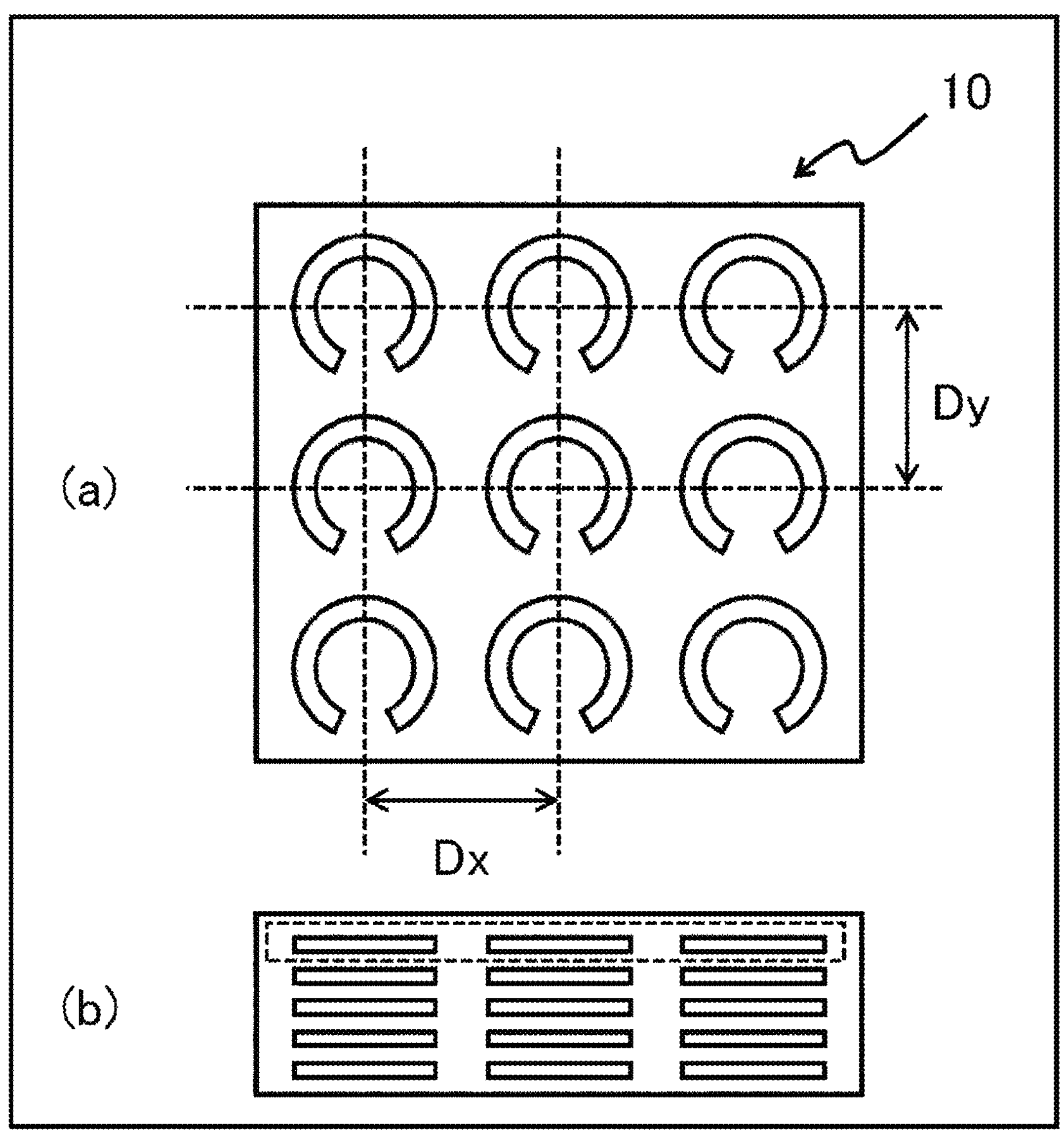
FIG. 10 is a view for explaining an aspect of the conductive materials.

When a plurality of the conductive material layered portions are disposed, the aspect of arrangement is not particularly limited, and may be as desired. For example, the conductive material layered portions may be provided at each vertex of each polygonal shape when triangular shapes, quadrilateral shapes, or hexagonal shapes are arranged adjacent to each other without gaps as illustrated in FIGS. 9, (a) to 9, (c), or may be randomly provided as illustrated in FIG. 9, (d). In FIGS. 9, (a) to 9, (d), each black dot represents a conductive material layered portion, and representations of the substantially C-like shapes of the conductive materials constituting the conductive material layered portion are omitted. From the viewpoint of improving the reflection/absorption performance, the conductive material layered portions are preferably disposed at each vertex of each polygonal shape when quadrangular shapes are adjacently arranged without gaps as illustrated in FIG. 9, (b), and more preferably disposed in the planar direction of the sheet, forming a plurality of rows formed at equal intervals and extending in a certain direction as illustrated in FIG. 10, (a). FIG. 10 is a view illustrating a state of arrangement of the conductive material layered portions as viewed from above in the thickness direction of the sheet, and is a view in a case in which the opening directions of the substantially C-like shapes of the conductive materials are all the same direction. In FIG. 10, a pitch width of the conductive material layered portions disposed at equal intervals in the certain direction described above is denoted by Dx, and a pitch width of the conductive material layered portions disposed at equal intervals in a direction orthogonal to the certain direction is denoted by Dy. Further, such an arrangement at equal intervals may be applied to a portion or to all of the conductive material layered portions present in the sheet, but may be applied to all from the viewpoint of sufficiently achieving the effect obtained by this arrangement.

Furthermore, from the viewpoint of improving the reflection/absorption performance, as illustrated in FIG. 10, (b), preferably each of the plurality of conductive material layered portions is disposed with each of the conductive materials constituting the conductive material layered portion substantially parallel to the planar direction of the sheet, thereby forming a plurality of layers in the planar direction including a plurality of conductive materials on the same plane. Such an aspect may be applied to a portion or to all of the conductive material layered portions present in the sheet, but may be applied to all from the viewpoint of sufficiently achieving the effect obtained by this arrangement. A layer formed of the conductive materials included in a region surrounded by a dashed line in FIG. 10, (b) is one of "the layers in the planar direction including a plurality of conductive materials on the same plane".

Furthermore, in a case in which the direction of the electromagnetic waves transmitted in the thickness direction of the sheet is fixed, from the perspective that the reflection/absorption performance is preferably averaged even when the sheet rotates in the planar direction, preferably each of the plurality of layers in the planar direction independently includes a specific region A satisfying the following Condition 1:

Condition 1: In each of the plurality of rows of the conductive materials formed extending in the certain direction in the specific region A, given the conductive material at one of two ends of the row as a reference, the conductive materials are disposed with angles respectively formed between an opening direction of the substantially C-like shape of the conductive materials and an opening direction of the substantially C-like shape of the conductive material serving as the reference as viewed from above in the thickness direction of the sheet increasing in increments of $\theta_1$ toward the conductive material at the other end; and the $\theta_1$ satisfies $0° < \theta_1 < 360°$ with a tolerance of less than $\theta_1/2$.

Furthermore, from the viewpoint of ease of manufacture in terms of design and production, the specific region A preferably satisfies the following Condition 3A:

Condition 3A: The $\theta_1$ satisfies "$(360°/\theta_1)=n$ (where n is a natural number other than 1)".

Furthermore, from the viewpoint of ease of manufacture in terms of design and production, the specific region A preferably satisfies the following Condition 4A:

Condition 4A: The number of the conductive materials included in each of the plurality of rows of the conductive materials formed extending in the certain direction is $360°/\theta_1$.

Further, in a case in which the direction of the electromagnetic waves transmitted in the thickness direction of the sheet is fixed, from the viewpoint that the reflection/absorption performance is preferably averaged even when the sheet rotates in the planar direction, the conductive material layered portions are preferably further disposed in the planar direction of the sheet, forming a plurality of rows formed at equal intervals and extending in the direction orthogonal to the certain direction and, in the specific region A, each layer of the plurality of layers in the planar direction independently satisfies the following Condition 2:

Condition 2: In each of the plurality of rows of the conductive materials formed extending in the direction orthogonal to the certain direction in the specific region A, given the conductive material at one of the two ends of the row as a reference conductive material, the conductive materials are disposed with angles respectively formed between the opening direction of the substantially C-like shape of the conductive materials and the opening direction of the substantially C-like shape of the reference conductive material as viewed from above in the thickness direction of the sheet increasing in increments of $\theta_1'$ toward the conductive material at the other end; and the $\theta_1'$ satisfies $0° < \theta_1' < 360°$ with a tolerance of less than $\theta_1'/2$.

Furthermore, from the viewpoint of ease of manufacture in terms of design and production, the specific region A preferably satisfies the following Condition 3B:

Condition 3B: The $\theta_1$ satisfies "$(360°/\theta_1)=n$ (where n is a natural number other than 1)".

Furthermore, from the viewpoint of ease of manufacture in terms of design and production, the specific region A preferably satisfies the following Condition 4B: Condition 4B: The number of the conductive materials included in each of the plurality of rows of the conductive materials formed extending in the direction orthogonal to the certain direction is $360°/\theta_1'$.

Note that, in the present disclosure, "$\theta_1$" and "$\theta_1'$" described above and "$\theta_2$" described below are used to indicate a degree of rotation of the conductive material, as described above. When an attempt is made to arrange one conductive material of the conductive materials at an angle of $\theta_1$, for example, the angle may shift in position from the angle of $\theta_1$. In this case, when the shift in position is not significant, the desired effect can be obtained. Therefore, in the present embodiment, an expression such as "with a tolerance less than $\theta_1/2$" is used to indicate the permissible range of the shift in position.

When the expression "with angles increasing in increments of $\theta_1$" in Condition 2 described above is used, this indicates that, for example, given $\theta_1=30°$, the increase in the angles from the first layer to the second layer is less than $30°\pm15°$ (more than 15° and less than 45°), and the increase in the angles from the first layer to the third layer is less than $60°\pm15°$ (more than 45° and less than 75°).

The tolerance of $\theta_1$ is, from the viewpoint of improving shielding performance, reducing reflectance, and increasing absorptance, typically less than $\theta_1/2$, preferably $\theta_1/3$ or less, preferably $\theta_1/4$ or less, preferably $\theta_1/5$ or less, preferably $\theta_1/10$ or less, preferably $\theta_1/20$ or less, and may be $\theta_1/100$ or more, $\theta_1/50$ or more, $\theta_1/30$ or more, or $\theta_1/25$ or more.

The condition for intersection of this $\theta_1$ can be similarly applied to $\theta_1'$ and $\theta_2$.

Further, in a case in which the direction of the electromagnetic waves transmitted in the thickness direction of the sheet is fixed, from the viewpoint of improving the reflection/absorption performance at a specific rotation angle of the sheet in the planar direction, preferably the conductive material layered portions are further disposed in the planar direction of the sheet, forming a plurality of rows formed at equal intervals and extending in the direction orthogonal to the certain direction and, in the specific region A, each layer of the plurality of layers in the planar direction independently satisfies the following Condition 2':

Condition 2': In each of the plurality of rows of the conductive materials formed in the direction orthogonal to the certain direction in the specific region A, the conductive materials are disposed with the opening directions of the substantially C-like shapes of all of the conductive materials constituting the row as viewed from above in the thickness direction of the sheet being the same.

Given 100% as the number of all conductive material layered portions included in the sheet, the number of the conductive material layered portions included in the entire region corresponding to the specific region A is not particularly limited. However, from the viewpoint of improving the reflection/absorption performance, the number is typically 30% or more, preferably 50% or more, more preferably 70% or more, still more preferably 80% or more, particularly preferably 90% or more, most preferably 100%, and may be 100% or less or less than 100%.

Figure 11:
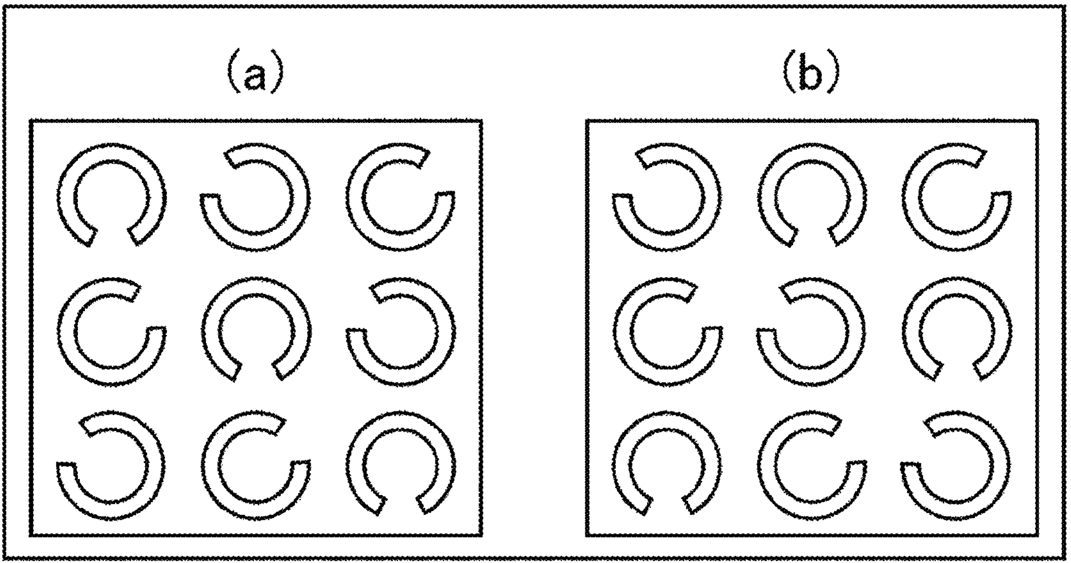
FIG. 11 is a view for explaining an array of the conductive materials, each having a substantially C-like shape, in a planar direction of the sheet.

FIG. 11 illustrates examples of the arrangement of the conductive materials in an aspect in which Condition 1, Condition 2, Condition 3A, Condition 3B, Condition 4A, and Condition 4B described above are satisfied and the $\theta_1$ described above is 120°. In this case, the arrangement of all of the plurality of layers in the planar direction described above may be as illustrated in FIG. 11, (a), or the arrangement of the layers may differ from each other, with the first layer being arranged as illustrated in FIG. 11, (a) and the second layer being arranged as illustrated in FIG. 11, (b).

In a case in which the direction of the electromagnetic waves transmitted in the thickness direction of the sheet is fixed, from the viewpoint that the reflection/absorption performance is preferably averaged even when the sheet rotates in the planar direction, $\theta_1$ described above is typically 2° or more, preferably 10° or more, more preferably 30° or more, even more preferably 90° or more, and may be more than 90°, and may be 180° or less, and may be less than 180°.

Further, in a case in which the direction of the electromagnetic waves transmitted in the thickness direction of the sheet is fixed, from the viewpoint that the reflection/absorption performance preferably improves at a specific rotation angle of the sheet in the planar direction, preferably each layer of the plurality of layers independently includes a specific region B satisfying the following Condition 5 instead of the specific region A described above:

Condition 5: Opening directions of the substantially C-like shapes of all of the conductive materials in the specific region B as viewed from above in the thickness direction of the sheet are the same (including substantially the same).

This specific region B is a region where the conductive materials in the respective layers are disposed as illustrated in FIG. 10, (a).

In the case of an aspect in which each layer of the plurality of layers independently satisfies Condition 5, the opening directions of the substantially C-like shapes of all the conductive materials included in the plurality of layers in the planar direction described above may be the same (including substantially the same), or the arrangements of the layers may differ from each other, with the opening directions of the substantially C-like shapes of the conductive materials in the first layer and the opening directions of the substantially C-like shapes of the conductive materials in the second layer being different from each other.

Note that, in the aspects of Condition 1, Condition 2, Condition 3A, Condition 3B, Condition 4A, and Condition 4B described above, given $\theta_1$ is 360°, the aspect of Condition 5 is obtained.

A pitch width (distance between centers of the conductive material layered portions adjacent to each other) in a case in which the conductive material layered portions are disposed at equal intervals is not particularly limited. However, the pitch width is typically 50 μm or more, preferably 100 μm or more, more preferably 150 μm or more, and still more preferably 200 μm or more from the viewpoint that the absorption performance deteriorates due to an increase in the reflectance of the electromagnetic waves in dense portions of the substantially C-like shapes, and is typically 5000 μm or less, preferably 4000 μm or less, more preferably 3000 μm or less, and still more preferably 2000 μm or less from the viewpoint that the absorption performance deteriorates due to an increase in the transmittance of the electromagnetic waves in rough portions of the substantially C-like shapes.

In a case in which the conductive material layered portions are disposed in the planar direction of the sheet at equal intervals in the certain direction and at equal intervals in the direction orthogonal to the certain direction, the condition of the pitch width described above may be satisfied only in the certain direction, or may be satisfied in both the certain direction and the direction orthogonal to the certain direction, but is preferably satisfied in both directions from the viewpoint that the transmittance of the electromagnetic waves is increased in a rough portion due to variation in the density of the substantially C-like shapes, deteriorating the absorption performance.

Figure 12:
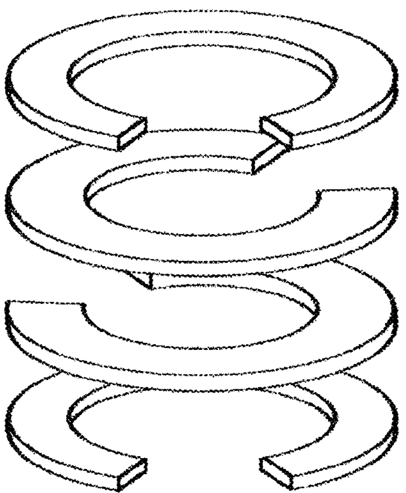
FIG. 12 is a view for explaining opening directions of the conductive materials having substantially C-like shapes and constituting the conductive material layered portion.

In a case in which the direction of the electromagnetic waves transmitted in the thickness direction of the sheet is fixed, preferably the sheet includes, as the one or more conductive material layered portions, at least one specific conductive material layered portion in which the opening directions of the substantially C-like shapes of the conductive materials constituting the conductive material layered portion, as viewed from above in the thickness direction of the sheet, differ from each other at least in part as illustrated in FIG. 12, from the viewpoint that the reflection/absorption performance is preferably averaged even if the sheet does not rotate in the planar direction.

Furthermore, as illustrated in FIG. 12, the sheet preferably includes, as the one or more specific conductive material layered portions, at least one specific conductive material layered portion in which the opening directions of the substantially C-like shapes of, among the conductive materials constituting the specific conductive material layered portion, two conductive materials respectively disposed on an uppermost surface side and a lowermost surface side of the sheet are the same (or substantially the same), from the viewpoint of reducing, to the extent possible, the difference between the effect obtained when electromagnetic waves are incident on the sheet from the direction of one surface and the effect obtained when electromagnetic waves are incident on the sheet from the direction of the other surface, that is, from the viewpoint of making the sheet easier to use without considering the front and back surfaces.

Furthermore, in a case in which the direction of the electromagnetic waves transmitted in the thickness direction of the sheet is fixed, the sheet preferably includes, as the one or more specific conductive material layered portion, at least one specific conductive material layered portion satisfying the following Condition 6, from the viewpoint that the reflection/absorption performance is preferably averaged even if the substantially C-like shapes do not rotate in the thickness direction.

Condition 6: In the at least one specific conductive material layered portion, given one of two conductive materials disposed on the uppermost surface side and the lowermost surface side of the sheet as a reference conductive material and $\theta_2$ as an angle formed between an opening direction of the substantially C-like shape of the conductive materials and an opening direction of the substantially C-like shape of the reference conductive material as viewed from above in the thickness direction of the sheet, the opening direction of the substantially C-like shape of the conductive materials, other than the reference conductive material, included in the specific conductive material layered portion is represented by $m\theta_2$; the m is a natural number; and the $\theta_2$ satisfies $0° < \theta_2 < 360°$ with a tolerance of less than $\theta_2/2$.

Furthermore, from the viewpoint of ease of manufacture in terms of design and production, preferably the specific conductive material layered portion includes k (where k is a natural number) conductive materials, each with the m being a natural number of d or less satisfying the following Condition 7 and the opening direction of the substantially C-like shape satisfying $m\theta_2$:

Condition 7: The d satisfies "$(360°/\theta_2) = d$ (where d is a natural number other than 1)".

When Condition 7 described above is satisfied, the specific conductive material layered portion may include the reference conductive material and d×k conductive materials. For example, in Example 1 of the examples described below, the sheet is constituted by a total of 16 conductive materials, including the reference conductive material and 3×5 (d=3, k=5)=15 conductive materials.

FIG. 12 illustrates an example of the arrangement of the conductive materials in an aspect in which Condition 6 and Condition 7 described above are satisfied, $\theta_2$ described above is 120°, and k=1. That is, one of the two conductive materials disposed at the uppermost portion and the lowermost portion in FIG. 12 is the reference conductive material, and the other conductive materials are the conductive materials in which the opening direction of the substantially C-like shape is $m\theta_2$ (02=120°).

The $\theta_2$ described above is not particularly limited as long as Condition 6 described above is satisfied. However, in a case in which the direction of the electromagnetic waves transmitted in the thickness direction of the sheet is fixed, $\theta_2$ is typically 2° or more, preferably 10° or more, more preferably 300 or more, even more preferably 900 or more, and may be more than 90°, and is 180° or less, and may be less than 180°, from the viewpoint that the reflection/absorption performance is preferably averaged even when the substantially C-like shapes do not rotate in the thickness direction.

The k described above is not particularly limited as long as the value is a natural number. However, from the viewpoint that a thicker sheet thickness improves the reflection/absorption performance and that the performance reaches a ceiling at a certain thickness, k is typically 1 or more, preferably 2 or more, more preferably 3 or more, and still more preferably 4 or more, and is typically 32 or less, preferably 16 or less, more preferably 12 or less, and still more preferably 8 or less.

Note that, with regard to the specific conductive material layered portion including "k conductive materials, each with the opening direction of the substantially C-like shape satisfying $m\theta_2$," when a comparison is made between (1) the effect obtained from an aspect in which the conductive materials constituting one conductive layer have opening directions of 0°, 120°, 240°, 0°, 120°, 240°, and 0° in this order from the end portion (an aspect in which the conductive materials are disposed with the opening directions of the substantially C-like shapes rotating) and (2) the effect obtained from an aspect in which the opening directions are 0°, 0°, 120°, 120°, 240°, 240°, and 0°, (2) tends to have better shielding performance, lower reflectance, and greater absorptance.

Further, in a case in which the direction of the electromagnetic waves transmitted in the thickness direction of the sheet is fixed, the one or more conductive material layered portions may include at least one conductive material layered portion in which the opening directions of the substantially C-like shapes of all of the conductive materials constituting the conductive material layered portion, as viewed from above in the thickness direction of the sheet, are the same (including substantially the same).

In a case in which a plurality of the conductive material layered portions are present, the opening directions of the substantially C-like shapes of the respective conductive material layered portions may be the same (including substantially the same) or may be different from each other.

Note that, in the mode of Condition 6 and Condition 7 described above, given $\theta_1$ is 360°, the aspect of the conductive material layered portions in which the opening directions of the substantially C-like shapes are the same (including substantially the same) is obtained.

Figure 13:
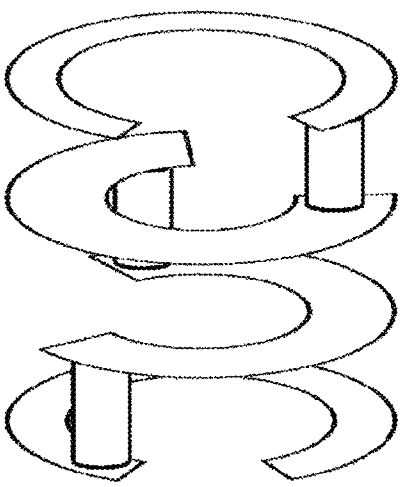
FIG. 13 is a view for explaining the conductive materials having a pillar shape.

As illustrated in FIG. 13, the sheet may include, as the one or more conductive material layered portion, at least one conductive material layered portion 3 including each conductive material 2 constituting the conductive material layered portion and a conductive material 4 having a pillar shape that connects to another conductive material 2 disposed adjacently in the thickness direction. The conductive material having the pillar shape preferably connects the end portions of the conductive materials 2 to each other. Note that, in FIG. 13, thicknesses of the conductive materials having substantially C-like shapes are not illustrated.

In a case in which the conductive material 4 having a pillar shape is provided, there is no space portion, a three-dimensional pseudo coil shape, that is, a helical antenna, is formed, and the reflection is increased. Therefore, when the effects of reflection and absorption of the electromagnetic waves are compared, the effect of reflection is greater.

On the other hand, in a case in which the conductive material 4 having a pillar shape is not provided, the space portions overlap, causing repetition of a phenomenon in which the electromagnetic waves reflected by the metal having substantially C-like shapes in the second and subsequent layers are absorbed by the layer in front. Therefore, when the effects of reflection and absorption of the electromagnetic waves are compared, the effect of absorption is greater.

Although electromagnetic wave shielding can be performed regardless of the presence or absence of the conductive material 4 having a pillar shape, the aspect in which the conductive material 4 having a pillar shape is not provided improves the electromagnetic wave shielding properties. The aspect in which the conductive material 4 having a pillar shape is not provided can be expressed as an aspect in which the conductive materials constituting the conductive material layered portion are not electrically continuous with each other.

The pillar shape is not particularly limited, and may be a circular pillar shape or a polygonal pillar shape such as a triangular pillar shape or a quadrangular pillar shape. However, with a polygonal pillar shape in which a total length of the substantially C-like shape is long, the reciprocation distance of electric field is long and the LC resonance is efficient, but the loss of the effect at corner areas is significant, and thus the circular pillar shape is preferred.

The material of the substantially C-like shape described above can be similarly applied to the material of the conductive material having a pillar shape. The material of the conductive material having a pillar shape and the material of the substantially C-like shape may be the same material or different, but preferably are the same from the viewpoint of lowering manufacturing costs.

The volume resistivity of the conductive material is not particularly limited and may be any value approximately sufficient for making a minute current flow. Through studies, the present inventor found that a resonance frequency changed little between copper with a volume resistivity of 1.55 μΩcm (0° C.), silver with a volume resistivity of 1.47 μΩcm (0° C.), and tungsten with a volume resistivity of 4.9 μΩcm (0° C.). An example of the value approximately sufficient for making a minute amount of power flow described above includes a volume resistivity of 3352.8 μΩcm (20° C.) in a case in which carbon (graphite) is used.

The thermal conductivity of the conductive material is not particularly limited. Through studies, the present inventor found that the resonance frequency changed little between copper with a thermal conductivity of 394 W/m·K, silver with a thermal conductivity of 427 W/m·K, and tungsten with a thermal conductivity of 174.3 W/m·K.

[Base Material]

In the sheet, the base material containing the conductive materials described above may be a rigid material or a flexible material, and the material serving as the base material (hereinafter also referred to as "base material") is not particularly limited as long as the material is an insulating material (non-conductive material). Examples thereof include resin, cellulose, ceramic, and rubber. For use in electronic devices, resin is preferable from the viewpoint of high heat resistance, weather resistance (shielding against moisture and corrosive gas), and flexibility. Specific aspects of the insulating material will be described below.

(1) Inorganic Solid Insulating Material

As the insulating material, an inorganic solid insulating material such as mica, porcelain (ceramic), or glass can be used for electric and power applications. Mica is a naturally occurring crystal having excellent insulating properties and heat resistance. White mica and gold mica are processed into mica products such as plates, sheets, and tape and are widely used for the insulation of coils and the like. Ceramic is obtained by molding mineral powder and firing the mold at a high temperature. Examples thereof include feldspar ceramic used for insulators and porcelain tubes, and steatite ceramic used for high-frequency insulators, semiconductor packages, and the like, and alumina ceramic. Glass is a material that is hard and brittle, but is transparent and excellent in terms of heat resistance and insulating properties. Soda-lime glass, lead glass, borosilicate glass, silica glass (quartz glass), and the like are used for electric bulbs, cathode-ray tubes, and the like. Glass fibers obtained by stretching molten glass into fine fibers are used in varnish glass cloth, base materials of laminates, coatings of electric wires, and the like. Note that an inorganic solid insulator such as silicon dioxide $SiO_2$ (silica) is used to insulate the interior of semiconductor elements.

(2) Organic Fibrous Material

As a type of insulating material, an organic fibrous material such as paper, cotton yarn, silk, polyester, or synthetic fiber such as polyamide (nylon) can be used. Paper has long been impregnated with insulating oil or the like and used for the insulation of transformers, cables, or capacitors.

(3) Resin-Based Material

As a natural resin that can be used for the insulating material, shellac, rosin, or the like can be used. Examples of synthetic resin materials that can be used for the insulating material include thermoplastic resins such as polyethylene terephthalate, polyethylene, polyvinyl chloride, polystyrene, and polyester; and thermosetting resins such as phenol resin, melamine resin, epoxy resin, and silicone resin.

(4) Rubber-Based Material

As the insulating material, a rubber-based material such as natural rubber, butyl rubber, ethylene propylene rubber, or silicone rubber can be used.

(5) Paint-Based Material

As the insulating material, a paint-based material such as a coil varnish obtained by dissolving a natural resin or a synthetic resin in a solvent, or an enamel varnish can be used.

In a case in which a resin is used as the insulating material, the resin may be a thermosetting resin or a thermoplastic resin. Preferably, a thermosetting resin is used because the electromagnetic wave shielding sheet may be subjected to high temperatures depending on its use. Examples of the thermosetting resin include a thermosetting resin and a photocurable resin. Examples of the thermosetting resin include thermosetting acrylic resin, unsaturated polyester resin, epoxy resin, melamine resin, phenol resin, silicone resin, polyimide resin, and urethane resin. Examples of the photocurable resin include photocurable epoxy, photocurable polyester, photocurable vinyl compound, photocurable epoxy (meth)acrylate, and photocurable urethane (meth)acrylate. Among these, unsaturated polyester resin, photocurable polyester, epoxy resin, or photocurable epoxy is preferable, and particularly, for the sake of heat resistance, epoxy resin, or photocurable epoxy is preferable. One of these types of resin may be used, or any two or more of these types of resin may be used in combination at any ratio.

The content of the base material in the sheet is not particularly limited and can be set within a range in which the effects of the present disclosure can be obtained. The content may be 30 wt. % or more, 40 wt. % or more, 50 wt. % or more, 60 wt. % or more, 70 wt. % or more, 80 wt. % or more, 90 wt. % or more, 95 wt. % or more, 99 wt. % or more, 99.9 wt. % or more, 99.95 wt. % or more, and 99.99 wt. % or less, 99.9 wt. % or less, 99 wt. % or less, 95 wt. % or less, 90 wt. % or less, 80 wt. % or less, 70 wt. % or less, 60 wt. % or less, or 50 wt. % or less.

The conductive materials are preferably completely buried in the base material. However, the conductive materials need not be completely buried (only partially buried), that is, an aspect may be adopted in which a portion of the conductive materials may be exposed to the outside air.

The refractive index of the resin, which is not particularly limited, is typically 1.35 to 1.76, and is preferably 1.55 to 1.61 achieved by epoxy resin, from the viewpoint of improving the electromagnetic wave shielding properties. The refractive index can be measured using a known method.

[Other Materials]

The sheet may include a material other than the conductive materials described above and the desired base material (other material), such as an inorganic filler other than the conductive materials, for example. For example, the coefficient of linear expansion of the sheet can be adjusted by the addition of the inorganic filler, which makes it easy to prevent the sheet from having warpage, deflection, waviness, and the like.

The content of the inorganic filler other than the conductive materials in the sheet is not particularly limited, and may be set as desired as long as the effects of the present embodiment can be achieved.

[Aspect of Sheet]

The shape of the sheet is not particularly limited as long as the shape is a sheet shape, and can be changed as appropriate depending on the position where the sheet is to be disposed. The sheet may be a single layer sheet, or may be a laminated sheet. In the case of a laminated sheet, a plurality of sheets of the present embodiment may be layered in one aspect, and other sheets may be layered to provide various functions in another aspect.

The thickness of the sheet, which is not particularly limited, is typically 10 μm or more, preferably 20 μm or more, still more preferably 50 μm or more, still more preferably 100 μm or more, and is typically 20 mm or less, preferably 10 mm or less, more preferably 5 mm or less, and still more preferably 3 mm or less, from the viewpoint of reducing the size, weight, and thickness of modern electronic devices such as cell phones, smartphones, tablets, or the like.

The shape of the sheet is flat, but may have unevenness as long as the sheet can be regarded as being approximately flat, and may be partially curved. Furthermore, the surface shape of the sheet may be a circular shape, or a polygonal shape such as a triangular or quadrangular shape.

[Characteristics of Sheet]

In the present disclosure, the electromagnetic wave shielding properties are evaluated by evaluating power transmittance $T(\omega)$ through the method described below. The evaluation method is a method based on terahertz time domain spectroscopy used in a transmittance measurement test.

Figure 14:
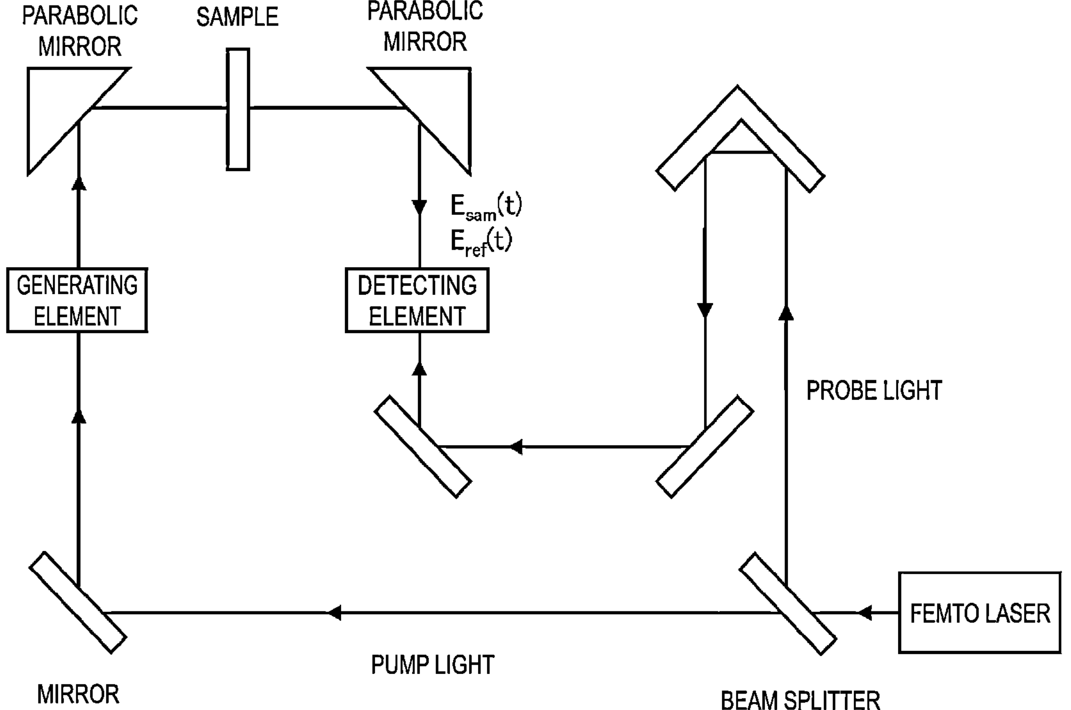
FIG. 14 is a view schematically illustrating a test device for evaluating electromagnetic wave shielding properties.

FIG. 14 is a schematic view of a test device. First, light from a femtosecond laser is divided into pump light and probe light by a beam splitter. The pump light functions as light that excites terahertz waves. The probe light is for adjusting the timing of measuring the terahertz waves. The detection timing is shifted by changing the optical path length of the probe light through movement of a delay stage. An electric field $E_{sam}(t)$ after the terahertz waves have passed through the sample and an electric field $E_{ref}(t)$ after the terahertz waves have passed through the air without the sample are detected. Using these values, a complex refractive index, a complex permittivity, a transmittance, an absorption coefficient, a reflection coefficient, a power spectrum, and the like are obtained.

Using the data obtained from the measurement described above, the transmittance is obtained through Fourier transform. The Fourier transform is performed on the obtained electric field waveforms $E_{sam}(t)$ and $E_{ref}(t)$, and $E_{sam}(\omega)$ and $E_{ref}(\omega)$ are obtained, respectively. The following Formula (A) expresses the power transmittance $T(\omega)$.

[Math. 1]

$$T(\omega) = \frac{|E_{sam}(\omega)|^2}{|E_{ref}(\omega)|^2} \quad \text{(A)}$$

The transmittance described above can be measured by a terahertz spectroscopy system (TAS 7500 TSH manufactured by Advantest Corporation, for example).

From the power transmittance T(w) described above, shielding performance L (dB) can be obtained using the following Formula (B).

$$L = 10 \times \mathrm{Log}_{10}(T(\omega)/100) \quad \text{(B)}$$

The shielding performance L, which is not particularly limited, is typically −2 dB or less, preferably −5 dB or less, and more preferably −10 dB or less. For preventing the malfunctioning of electronic devices such as computers, the shielding performance L is preferably −20 dB or less, more preferably −30 dB or less, even more preferably −40 dB or less, particularly preferably −60 dB or less, and more particularly preferably −80 dB or less. The lower limit of the shielding performance L, which is not necessarily set, is typically −90 dB or more. Note that the power transmittance T(ω) of the electromagnetic waves is expressed as −20 dB (shield ratio: 90%) when the electromagnetic waves are reduced to 1/10, is expressed as −40 dB (shield ratio: 99%) when the electromagnetic waves are reduced to 1/100, is expressed as −60 dB (shield ratio: 99.9%) when the electromagnetic waves are reduced to 1/1000, and is expressed as −80 dB (shield ratio: 99.99%) when the electromagnetic waves are reduced to 1/10000.

<Method for Manufacturing Sheet>

Embodiments related to a method for manufacturing the sheet will be described below. Note that the method for manufacturing the sheet described above is not limited to these manufacturing methods. Manufacturing conditions applicable to various other embodiments can be applied to these embodiments. The conditions for the sheet described above can be applied to the conditions for the manufacturing methods described below, within a range of applicability.

First Aspect

A first aspect of a method for manufacturing the sheet which is another embodiment of the present disclosure (also simply referred to as "sheet" in the description of the present embodiment) is a method including preparing a plurality of layer-forming sheets, each including a base material and conductive materials having substantially C-like shapes, and arranging each conductive material with a circumferential direction of the substantially C-like shape of the conductive material and a planar direction of the layer-forming sheet substantially parallel to each other; and layering the plurality of layer-forming sheets with at least some of the plurality of conductive materials forming a conductive material layered portion in which a plurality of the conductive materials are disposed in a thickness direction of the sheet without being in contact with each other.

A method for manufacturing a sheet in a case in which the sheet includes the conductive material having a pillar shape described above is a method including preparing a plurality of layer-forming sheets, each including a base material, conductive materials having substantially C-like shapes, and a conductive material having a pillar shape connecting the conductive materials having the substantially C-like shapes (preferably, at end portions of the conductive materials having the substantially C-like shapes), and arranging each conductive material with a circumferential direction of the substantially C-like shape of the conductive material and a planar direction of the layer-forming sheet substantially parallel to each other; and layering the plurality of layer-forming sheets with at least some of the plurality of conductive materials forming a conductive material layered portion in which a plurality of the conductive materials are disposed in the thickness direction of the sheet without being in contact with each other and with the conductive materials having the substantially C-like shapes in one sheet being brought into contact with the conductive material having the pillar shape in the other sheet (preferably, at end portions of the conductive materials having the substantially C-like shapes).

The method for manufacturing the sheet includes the preparing of the layer-forming sheets and the layering described above, but may further include other steps. Hereinafter, the method for manufacturing the sheet will be described in detail including other steps. In this description, the method for manufacturing a sheet not including the conductive material having a pillar shape will be described. This detailed description is also applicable to the method for manufacturing a sheet including the conductive material having a pillar shape within an applicable range.

[Preparation of Composition]

The method for manufacturing the sheet according to the first aspect may include preparing a composition by dissolving and mixing the above-described base material (resin, for example) or other materials in a solvent. The method for the mixing is not particularly limited, and a known method can be used.

The type of solvent is not particularly limited as long as the above-described base material and other materials can be dissolved therein. Note that, as long as the composition can be molded without using a solvent, a solvent need not be used.

A curing agent may be added depending on the type of base material used. The curing agent of a known type may be used as appropriate in accordance with the base material. The content of the curing agent in the composition can be, for example, 0.05 to 15 wt. %.

Depending on the type of base material used, a polymerization initiator can be added. For example, as a thermal polymerization initiator, a thermal radical generator such as a peroxide such as benzoyl peroxide can be used. As a photopolymerization initiator, a photoradical generator, a photocation generator, a photoanion generator, or the like can be used.

[Preparation of Layer-Forming Sheet]

Figure 15:
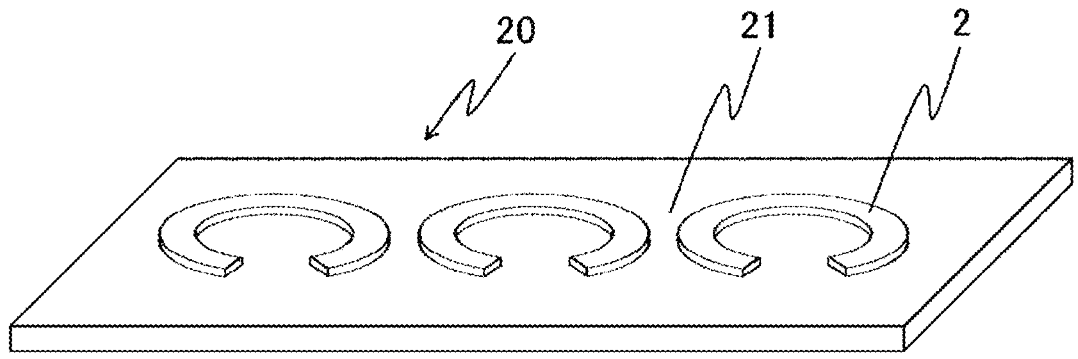
FIG. 15 is an external perspective view of an aspect of a layer-forming sheet.

The method for manufacturing the sheet according to the first aspect includes preparing the plurality of layer-forming sheets, each including the base material and the conductive materials having the substantially C-like shapes, and arranging each conductive material with the circumferential direction of the substantially C-like shape of the conductive material and the planar direction of the layer-forming sheet substantially parallel to each other. The method for preparing such layer-forming sheets is not particularly limited, and includes, for example, a method including preparing a mold in which the conductive materials having the substantially C-like shapes are arranged; pouring the composition obtained in the preparation of the composition described above into the mold; and curing the composition to obtain a layer-forming sheet 20 including a composition cured object 21 (base material 21) and conductive materials 2 having substantially C-like shapes such as illustrated in FIG. 15. Examples of a method for curing the composition include a method using heat or light such as ultraviolet rays.

Furthermore, a method used in the manufacture of a typical printed wiring board may be used. Specifically, examples of a method for obtaining a layer-forming sheet by layering the conductive materials having substantially C-like shapes on a cured sheet include a method of preparing a cured sheet by curing the composition described above, forming conductive material foil on one side of the cured sheet, coating or laminating a photosensitive resist in a pattern with which the conductive material foil having substantially C-like shapes remains after the etching, and then etching. A method for layering the conductive materials having substantially C-like shapes on the cured sheet through etching may be performed through a method other than the one using the photosensitive resist described above. Specifically, the layering may be performed by inkjet printing or screen printing in which the substantially C-like shapes are directly formed.

Note that, with regard to the arrangement of the conductive material having substantially C-like shapes in the layer-forming sheet, the conditions described above for arranging the conductive materials having substantially C-like shapes in the planar direction of the sheet can be similarly applied within an applicable range.

In the case of manufacturing a sheet including the conductive material having a pillar shape, the method may include forming a hole (via) in an end portion of each of the conductive materials having substantially C-like shapes and included in the obtained layer-forming sheet using a drill, a laser, or the like, and then pouring a molten material of the conductive material or the like into this hole and solidifying the molten material. In this case, in the layering described below, the plurality of layer-forming sheets are layered with the conductive material having a pillar shape being disposed at the end portions of the conductive materials having substantially C-like shapes in other sheets adjacently layered.

[Layering]

The method for manufacturing the sheet includes layering the plurality of layer-forming sheets with at least some of the plurality of conductive materials forming a conductive material layered portion in which a plurality of the conductive materials are disposed in the thickness direction of the sheet without being in contact with each other.

Figure 16:
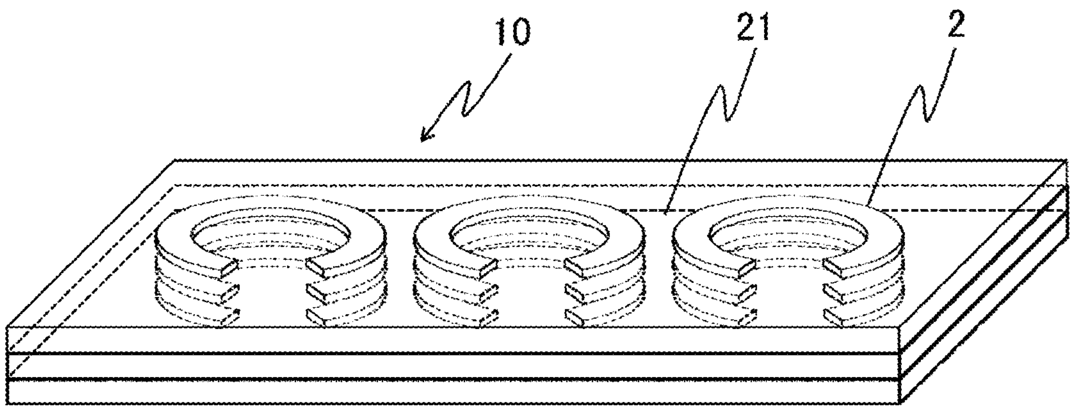
FIG. 16 is an external perspective view of an aspect of a sheet obtained by layering a plurality of the layer-forming sheets.
Figure 17:
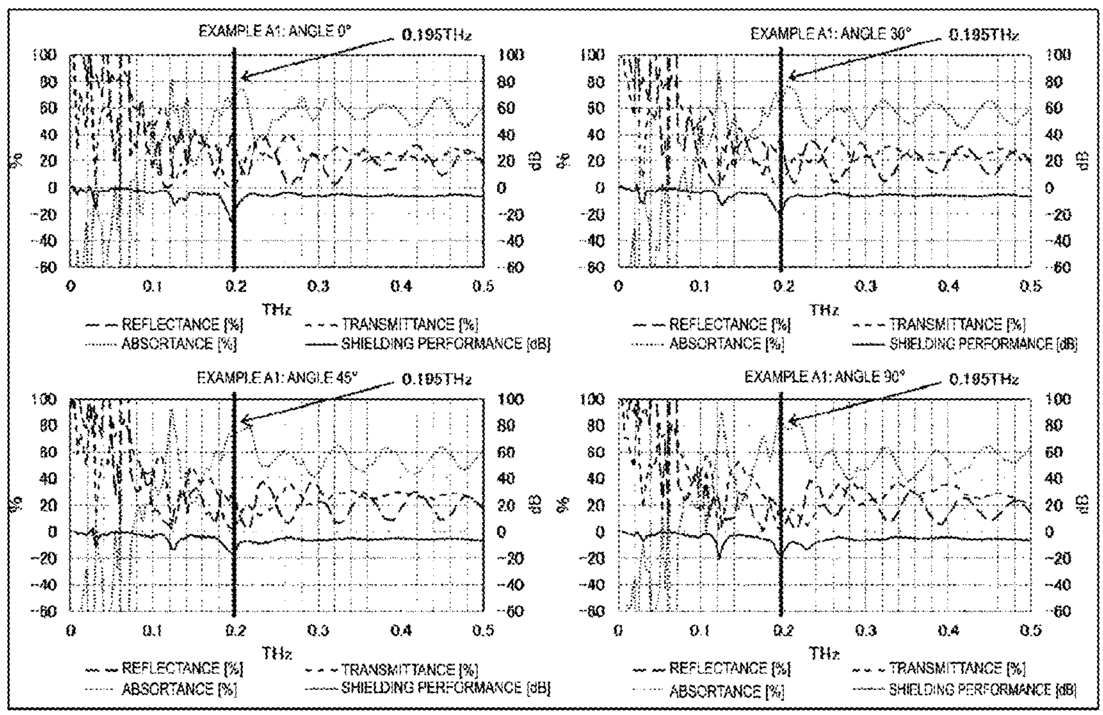
FIG. 17 is a diagram showing results of evaluation of characteristics of the sheet of Example A1.
Figure 18:
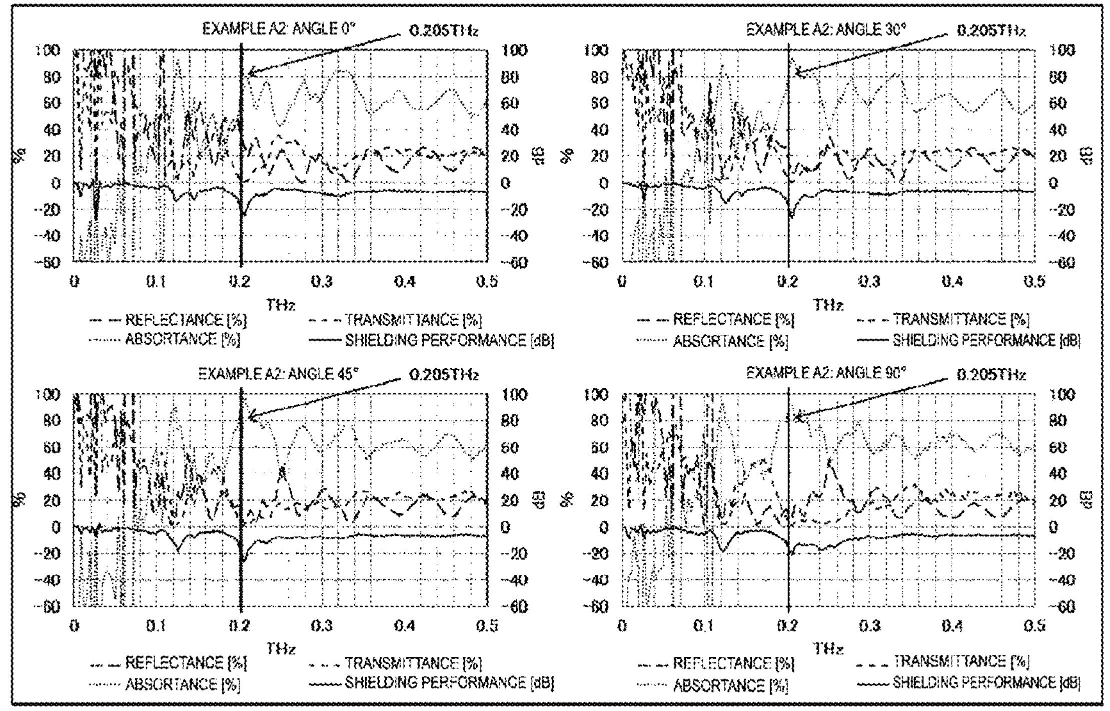
FIG. 18 is a diagram showing results of evaluation of characteristics of the sheet of Example A2.
Figure 19:
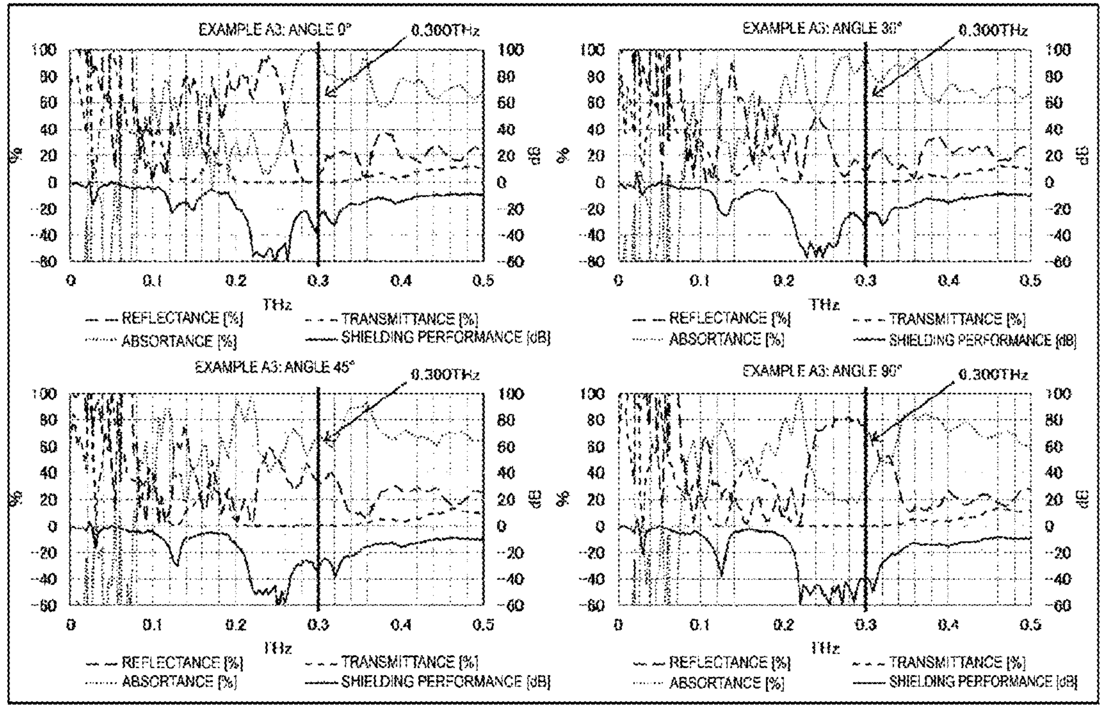
FIG. 19 is a diagram showing results of evaluation of characteristics of the sheet of Example A3.
Figure 20:
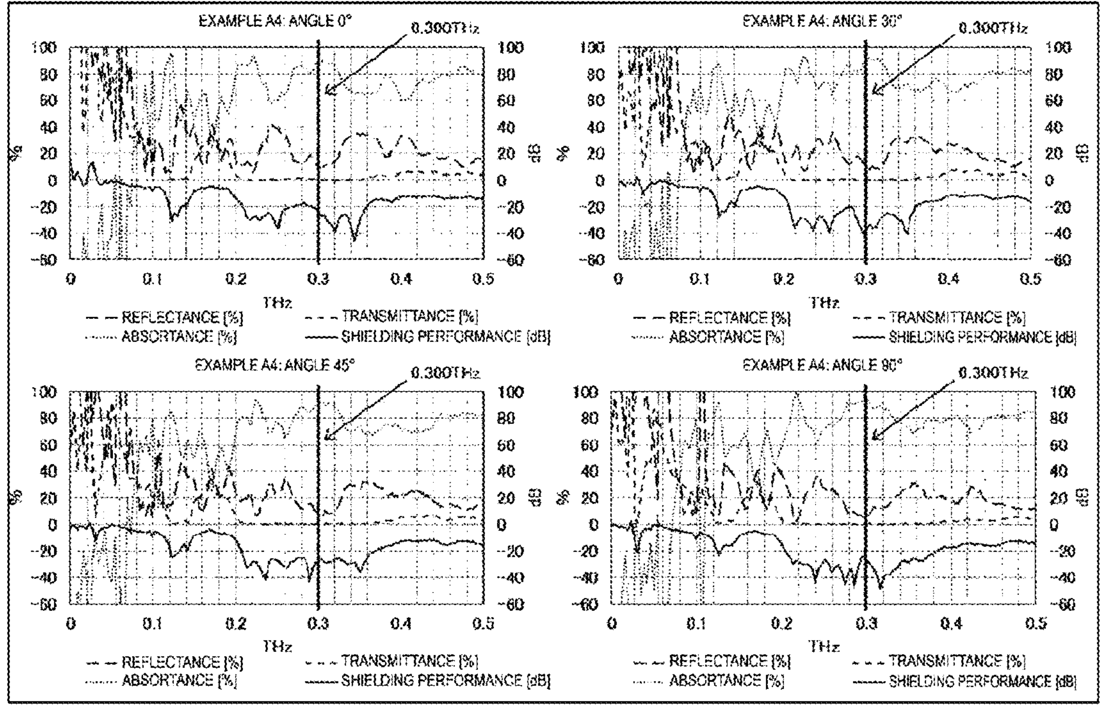
FIG. 20 is a diagram showing results of evaluation of characteristics of the sheet of Example A4.
Figure 21:
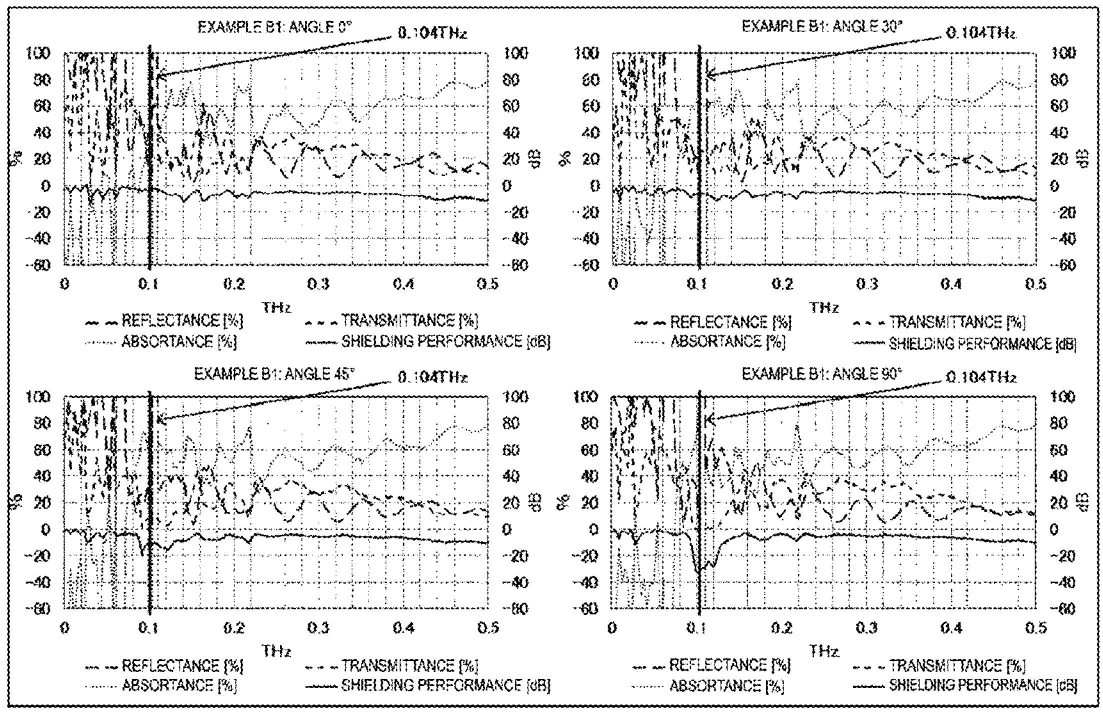
FIG. 21 is a diagram showing results of evaluation of characteristics of the sheet of Example B1.
Figure 22:
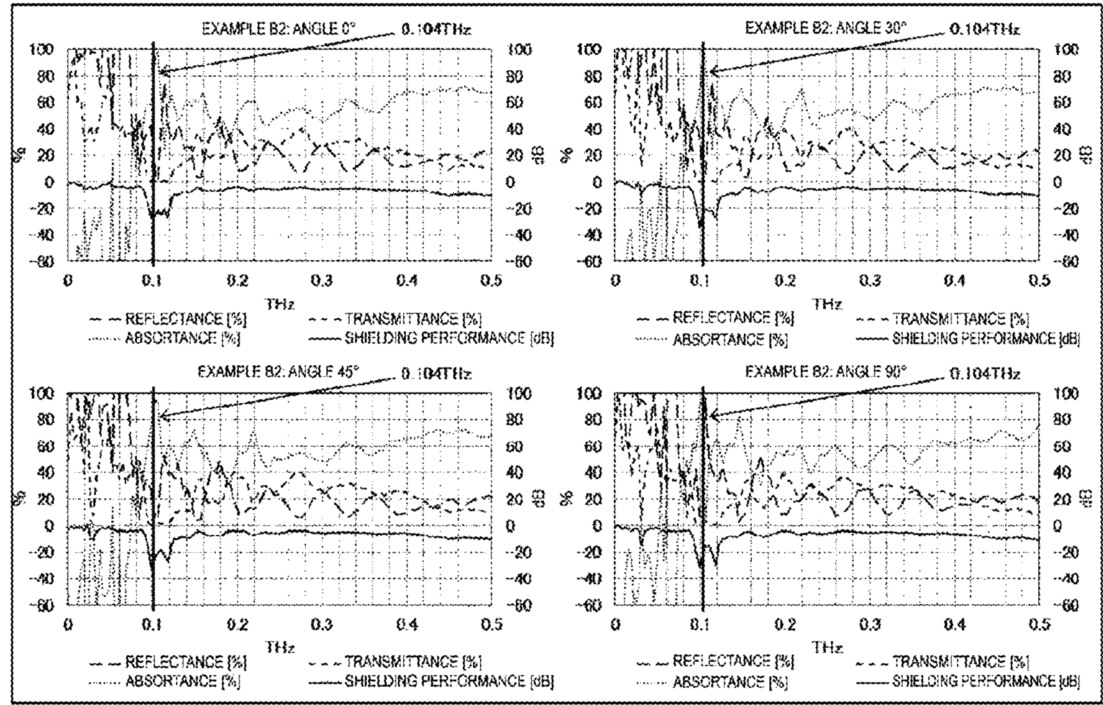
FIG. 22 is a diagram showing results of evaluation of characteristics of the sheet of Example B2.
Figure 23:
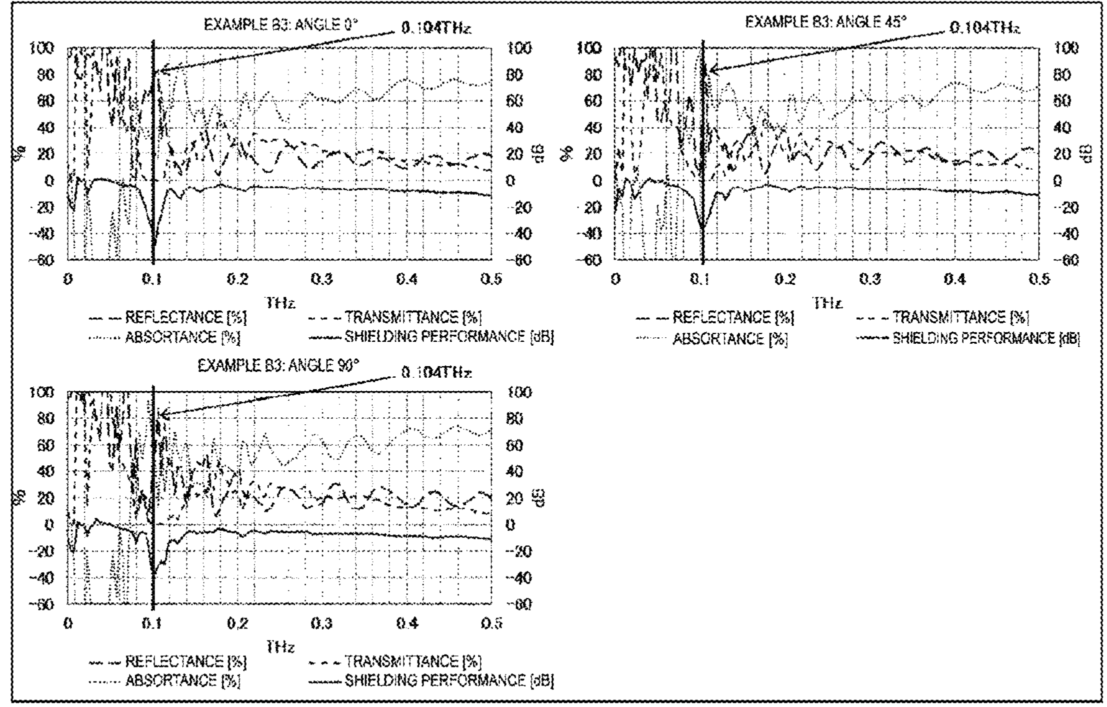
FIG. 23 is a diagram showing results of evaluation of characteristics of the sheet of Example B3.
Figure 24:
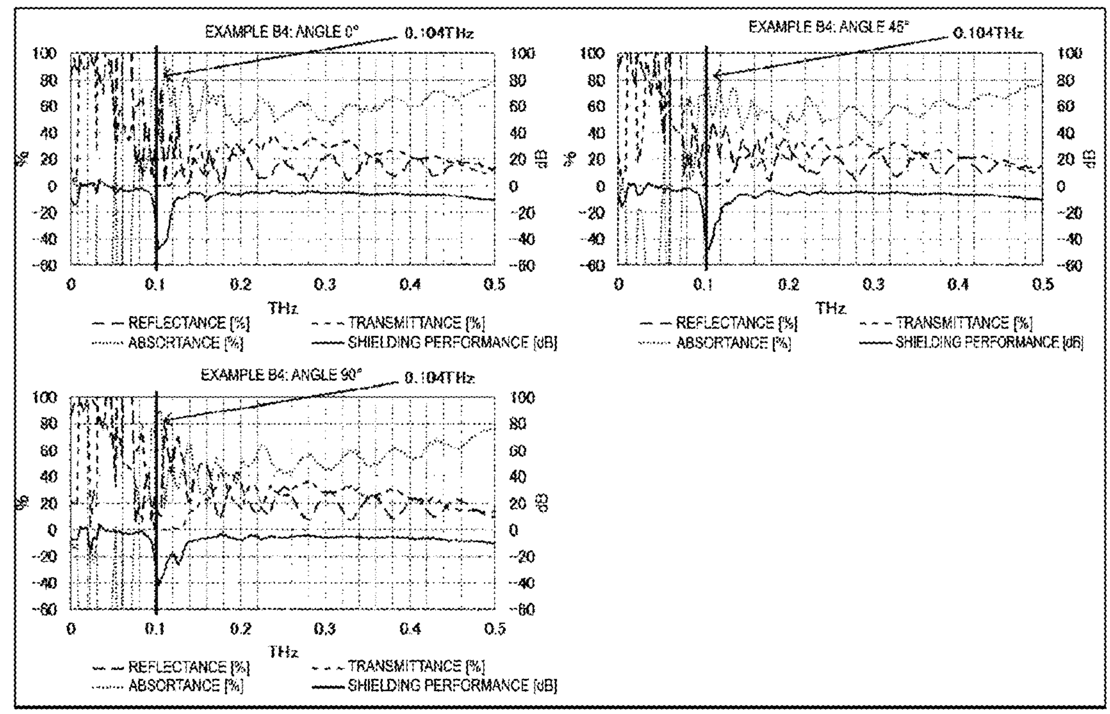
FIG. 24 is a diagram showing results of evaluation of characteristics of the sheet of Example B4.

The layering method is not particularly limited. For example, the plurality of layer-forming sheets are layered with the conductive material having substantially C-like shapes in one sheet and the conductive material having substantially C-like shapes in another sheet aligned in the thickness direction of the sheet using glue or other materials, as illustrated in FIG. 16.

Second Aspect

A second aspect of a method for manufacturing the sheet which is another embodiment of the present disclosure (also simply referred to as "sheet" in the description of the present embodiment) is a method including preparing layer-forming sheets by forming conductive materials 1 having substantially C-like shapes on a front surface of a base material layer 1 including a base material 1, and arranging each conductive material with a circumferential direction of the substantially C-like shape of the conductive material and a planar direction of the layer-forming sheet substantially parallel to each other; and layering by forming, on a front surface of the layer-forming sheet on a side where the conductive materials are present, a base material layer 2 including a base material 2 and conductive materials 2 having substantially C-like shapes (on a front surface of the base material layer 2), with at least a portion of the conductive materials forming a conductive material layered portion in which a plurality of the conductive materials are disposed in the thickness direction of the sheet without being in contact with each other.

The method for manufacturing the sheet according to the second aspect includes the preparing of the layer-forming sheet and the layering described above, but may further include other steps. Hereinafter, the method for manufacturing the sheet will be described in detail including other steps. In this description, the method for manufacturing a sheet not including the conductive material having a pillar shape will be described. This detailed description is also applicable to the method for manufacturing a sheet including the conductive material having a pillar shape within an applicable range.

[Preparation of Composition]

The method for manufacturing the sheet according to the second aspect may include preparing a composition by dissolving and mixing the above-described base material (resin, for example) and other materials in a solvent. For the preparation of the composition, the preparation of the composition of the first aspect described above may be similarly applied.

[Preparation of Layer-Forming Sheet]

The method for manufacturing the sheet according to the second aspect includes preparing the layer-forming sheet by forming the conductive materials 1 having substantially C-like shapes on the front surface of the base material layer 1 including the base material 1, and arranging the conductive material with the circumferential direction of the substantially C-like shape of the conductive material and the planar direction of the layer-forming sheet substantially parallel to each other. This preparation of the layer-forming sheet can be implemented by a method similar to the preparation of the layer-forming sheet in the first aspect described above.

[Layering]

The method for manufacturing the sheet according to the first second aspect includes layering by forming, on the front surface of the layer-forming sheet on a side where the conductive materials are present, the base material layer 2 including the base material 2 and the conductive materials 2 having substantially C-like shapes (on the front surface of the base material layer 2), with at least a portion of the conductive materials forming a conductive material layered portion in which a plurality of the conductive materials are disposed in the thickness direction of the sheet without being in contact with each other, as illustrated in FIG. 16.

The method for forming the base material layer 2 including the base material 2 on the front surface of the layer-forming sheet on the side where the conductive materials are present is not particularly limited. Examples thereof include a method of applying a solution obtained by dissolving the base material 2 in a solvent to the front surface of the layer-forming sheet and then removing the solvent, a method of applying a liquid including the base material 2 that is molten to the front surface of the layer-forming sheet and then solidifying the liquid, and a method of separately preparing a sheet including the base material 2 and pressing this sheet onto the surface of the layer-forming sheet using a press or the like.

The method for forming the conductive materials 2 having substantially C-like shapes on the front surface of the base material layer 2 is not particularly limited, and the method for manufacturing a printed wiring board in the first aspect described above can be used. In this case, a thin film conductive material foil before etching and the base material layer 2 described above may be pressed to the layer-forming sheet using a press or the like.

Further, when adhesion between the layers is difficult, a treatment for imparting adhesion, for example, a blackening treatment, a browning treatment, or an adhesive coating treatment may be performed on either one of the two layers to be adhered.

The number of times that the treatment for forming the base material layer 2 including the base material 2 and the conductive materials 2 having substantially C-like shapes (on the front surface of the base material layer 2) is performed is not particularly limited. The treatment may be performed once to form a final sheet having two layers, or may be performed a plurality of times to form a final sheet having three or more layers. Further, this treatment may be performed on only one surface of the layer-forming sheet, or may be performed on both surfaces from the viewpoint of improving manufacturing efficiency.

The layers layered by the method described above can be regarded as a layer obtained by repeating a layer including the conductive materials and the base material, and each layer can be regarded as a layer-forming sheet.

Further, in the case of manufacturing a sheet including the conductive material having a pillar shape, the method may include, for each layer-forming sheet formed, forming a hole (via) in an end portion of each of the conductive materials having substantially C-like shapes and included in the layer-forming sheet using a drill, a laser, or the like, and then pouring a molten material of the conductive material or the like into this hole and solidifying the molten material. In this case, the plurality of layer-forming sheets are layered with the conductive material having a pillar shape being disposed at end portions of the conductive materials having substantially C-like shapes in other sheets adjacently layered thereto.

<Application of Sheet>

The application of the sheet described above is not particularly limited, but is preferably used as an electromagnetic wave shielding sheet.

Other embodiments of the invention of the present application are devices including the resin molded body described above such as: an electric communication device such as an electronic device, a cable, a smartphone, a tablet, a smart watch, a smart security device, a monitoring device, or smart appliance; a consumer electronic device such as a computer circuit, a radio transmitter (including a smartphone), an electric motor, a flat panel display, or a liquid crystal display (LCD); an automobile device such as a safety system, a mobile medium, communications, a wireless headset, a battery-powered, electric, or hybrid powertrain, or a high-voltage battery system; a medical device such as a smart bed, a ventilator, a CT scan machine, or a transducer that needs to acquire information such as pulse or blood pressure and convert it into an electronic signal; an aerospace device or a defense device such as an aircraft, a vehicle, combat equipment, a weapon, an elastomeric gasket, a conductive paint, or an EMI shielded display; a system such as a railroad system, a mass transit system, a high voltage contact switching system, a signaling system, or a control system; or a digital weapon such as an electromagnetic bomb based on high-power surges, or an electronic bomb; attachment material for cables: wallpaper for server rooms and other buildings: aprons and other clothing for human protection; or other devices (devices other than those listed above that may include the resin molded body described above).

The aspect of use of the resin molded body of the embodiments described above is not particularly limited, and can be any aspect including the resin molded body as its member. The resin molded body of the embodiments is particularly preferably used for the electromagnetic wave shielding sheet.

For the step, the conditions of the preparing of the resin composition in the first manufacturing method described above may be similarly applied.

In particular, when the resin molded body is used as an electromagnetic wave control sheet (electromagnetic wave shielding sheet), the electromagnetic wave control sheet can be used in any way for the application of controlling (shielding) electromagnetic waves. For example, the electromagnetic wave control sheet may be installed surrounding an electronic device that may malfunction due to electromagnetic waves, making it possible to suppress the malfunction. In particular, the electromagnetic wave control sheet described above is superior to a known electromagnetic wave control sheet in blocking electromagnetic waves in a high frequency band, to attain shielding from electromagnetic waves from communication devices such as a cell phone and a smartphone that are expected to be used at higher frequencies, that is, in a higher frequency band such as 100 GHz or higher, for the sake of higher speed, larger capacity, shorter delay, and the like, and thus can be applied to a wider range of fields than the known electromagnetic wave control sheet. Note that, with the sheet described above, when the direction of arrival of electromagnetic waves from the outside and the sheet flat surface are orthogonal to each other, a particularly large electromagnetic wave control effect can be attained.

EXAMPLES

Hereinafter, the present disclosure will be specifically described with reference to examples. The present disclosure is not to be interpreted as being limited to the examples described below.

Note that, in this example, a plurality of conductive materials are arranged at angles of $\theta_1$, $\theta_1'$, or $\theta_2$, but in all examples, the tolerance of $\theta_1$ was $\theta_1/20$, the tolerance of $\theta_1'$ was $\theta_1'/20$, and the tolerance of $\theta_2$ was $\theta_2/20$ in this arrangement.

Test 1

Example A1 (X Direction, Y Direction: No Rotation, Thickness Direction: Rotation)

Quadrangular epoxy resin films (insulating layers), each including a front surface having a quadrangular shape of 40 mm vertically (referred to as an X direction) and 40 mm horizontally (referred to as a Y direction; a direction orthogonal to the X direction), having a thickness shown in Table 1, and containing an insulating filler, were prepared. This filler has insulating properties, and therefore can be treated substantially the same as an epoxy resin from the viewpoint of characteristics such as shielding performance described below.

Subsequently, copper foil having a thickness of He shown in Table 1 was thermally pressed to both surfaces of the film. Subsequently, a plurality of layer-forming sheets were prepared. Each layer-forming sheet was prepared by laminating a photosensitive resist on the layers of copper foil on both surfaces of the film, etching by light exposure using an exposure device, and then peeling off the photosensitive resist. Thus, the final conductive materials, each having a substantially C-like shape, were arranged at equal intervals in both a longitudinal direction (the same direction as the X direction described above) and a lateral direction (the same direction as the Y direction described above), forming a quadrangular arrangement on the whole, and the arrangement conditions of the conductive materials of the sheet finally obtained satisfied the arrangement conditions of the conductive materials. The number of the conductive materials present in the sheet was 78 (X direction)×78 (Y direction) per copper foil on one side. Table 1 shows the specific arrangement conditions of the conductive materials. The alignment pitch in Table 1 refers to the distance between the centers of, among the conductive materials arranged in the X direction, the conductive materials adjacent to each other, and refers to the distance between the centers of, among the conductive materials arranged in the Y direction, conductive materials adjacent to each other (the distances between the centers of the conductive materials adjacent to each other are the same in the X direction and the Y direction). Note that the conductive materials having substantially C-like shapes were disposed with a quadrangular shape formed by arranging the conductive materials having substantially C-like shapes side by side and the center of the epoxy resin film in alignment.

Furthermore, a sheet obtained by layering the layer-forming sheets and thus forming conductive material layered portions by the conductive materials having substantially C-like shapes in each of the layer-forming sheets was prepared using the method described below.

Both surfaces of the obtained layer-forming sheets were treated as follows.

The front surface of the layer-forming sheet obtained was subjected to general blackening treatment (treatment of degreasing, soft etching, washing with an acid, and blackening). Subsequently, the layer-forming sheet, a layer made of the same resin as the epoxy resin described above, and copper foil were pressed and thus layered in this order using a welding layup machine. Subsequently, the copper foil was etched by light exposure using a method similar to that in the preparation of the layer-forming sheet described above, and conductive materials having substantially C-like shapes were formed. Furthermore, the processing from the blackening treatment to the etching of the copper foil by light exposure was repeated until the final number of layers of the conductive materials was 16 (that is, the processing from the blackening treatment to the etching of the copper foil by light exposure was repeated seven times for each of both surfaces of the first layer-forming sheet) to manufacture a sheet. In this sheet, the arrangement of each conductive material constituting one conductive material layered portion was shifted in position in the thickness direction of the sheet. However, with regard to this shift in position, as in the arrangement of the conductive materials A, B, and C illustrated in FIG. 5, the arrangement of each conductive material other than the endmost conductive material included a portion that overlapped the endmost conductive material in the thickness direction of the sheet as viewed from the side surface side of the sheet and, as in the arrangement of the conductive materials A, B, and C illustrated in FIG. 7, the arrangement of each conductive material other than the endmost conductive material included a portion in which the space portion overlapped the endmost conductive material in the thickness direction of the sheet as viewed from the side surface side of the sheet. Further, as viewed from above in the thickness direction of the sheet, given 1 as the length Do of the largest possible line segment in the plane of each of the conductive material in the circumferential direction, all conductive materials constituting one conductive material layered portion were disposed inside a virtual circle having a diameter length of 2.0.

(Conditions of Arrangement of Conductive Materials)

Conditions of Arrangement of Conductive Materials in Sheet Planar Direction

Each of the plurality of layer-forming sheets independently satisfies the following Condition 5a1:

Condition 5a1: The opening directions of the substantially C-like shapes of all conductive materials as viewed from above in the thickness direction of the sheet are the same.

Condition of Arrangement of Conductive Materials in Sheet Thickness Direction

All conductive material layered portions included in the sheet satisfy the following Condition 6a1 and Condition 7a1:

Condition 6a1: The conductive material layered portion includes a reference conductive material that is one of the two conductive materials disposed on the uppermost surface side and the lowermost surface side of the sheet and, given 120° ($\theta_2$) as an angle formed between the opening direction of the substantially C-like shape of the conductive material and the opening direction of the substantially C-like shape of the reference conductive material as viewed from above in the thickness direction of the sheet, each conductive material layered portion includes five conductive materials in which the opening directions of the substantially C-like shapes each satisfy $m\times\theta_2$ for each natural number m less than or equal to d satisfying the following Condition 7a1:

Condition 7a1: d in Condition 6a1 described above satisfies "$(360°/\theta_2)=d$ (where d is a natural number other than 1)".

Specifically, because $\theta_2$ is 120°, d is 3 and m is 1, 2, or 3. Therefore, for each conductive material layered portion, the conductive materials were arranged with the respective opening directions of the substantially C-like shapes of the conductive materials from the reference conductive material to the conductive material positioned at the end portion of the conductive material layered portion on a side opposite to the reference conductive material being 0° (reference conductive material), 120°, 240°, 360°, 120°, 240°, 360°, 120°, 240°, 360°, 120°, 240°, 360°, 120°, 240°, and 360°.

Example A2 (X Direction, Y Direction: No Rotation, Thickness Direction: Rotation)

A sheet was prepared in the same manner as in Example A1, except that the alignment pitch in Condition 6a1 described above was changed to that shown in Table 1.

Example A3 (X Direction, Y Direction: No Rotation, Thickness Direction: Rotation)

A sheet was prepared in the same manner as in Example A1, except that the alignment pitch in Condition 6a1 described above was changed to that shown in Table 1.

Example A4 (X Direction, Y Direction: Rotation, Thickness Direction: Rotation)

Regarding the conditions for the arrangement of the conductive materials, a sheet was prepared in the same manner as in Example A3, except that the condition that "each of the plurality of layer-forming sheets independently satisfies the following Condition 5a1" was changed to the condition that "each of the plurality of layer-forming sheets is independently formed of only a plurality of the specific regions A that satisfy the following Condition 1a4 and Condition 2a4". The number of the specific regions A present in the sheet was set to 3 (X direction)×3 (Y direction).

Condition 1a4: In each row of the conductive materials formed in the X direction in the specific region A, given the conductive material at one of the two ends of the row as a reference, 360°/$\theta_1$ conductive materials are disposed with angles formed between each opening direction of the substantially C-like shape of the conductive material and an opening direction of the substantially C-like shape of the conductive material serving as the reference, as viewed from above in the thickness direction of the sheet, increasing in increments of 120° ($\theta_1$) toward the conductive material at the other end.

Condition 2a4: In each row of the conductive materials formed in the Y direction in the specific region A, given the conductive material at one of the two ends of the row as a reference, 360°/$\theta_1$' conductive materials are disposed with angles formed between each opening direction of the substantially C-like shape of the conductive material and an opening direction of the substantially C-like shape of the conductive material serving as the reference, as viewed from above in the thickness direction of the sheet, increasing in increments of 120° ($\theta_1$') toward the conductive material at the other end.

[Evaluation of Characteristics]

(Electromagnetic Wave Shielding Properties)

The electromagnetic wave shielding properties were evaluated by measuring the power transmittance T(ω) using a terahertz spectroscopy system (TAS 7500 TSH manufactured by Advantest Corporation). An aperture with a diameter of 10 mm was used.

Next, the electromagnetic wave shielding performance L (dB) was calculated from the power transmittance T (ω) obtained through measurement, based on the following Formula (B):

$$L = 10 \times \mathrm{Log}_{10}(T(\omega)/100) \quad \text{(B)}$$

Further, given 100% as the power transmittance T described above, a numerical value obtained by subtracting the reflectance obtained by the device described above from the transmittance was evaluated as the absorptance.

The electromagnetic waves were incident orthogonally to the sheet plane, and data acquisition was performed at each angle while the sheet was rotated on the plane. Among the examples, in Examples A1 to A3 in which there was no rotation in the X direction or the Y direction, an angle of an arrangement in which the ring opening direction of the substantially C-like shape of the conductive material on the sheet outermost surface (first layer) was parallel to the Y direction and an electric field (E) direction was parallel to the X direction was defined as 0°, and the sheet was rotated clockwise. Further, among the examples, in Example A4 having rotation in the X direction and the Y direction, an angle of an arrangement in which the ring opening direction of any one of the plurality of substantially C-like shapes in the specific region A was parallel to the Y direction and the electric field (E) direction was parallel to the X direction was defined as 0°, and the sheet was rotated clockwise. For these examples, measurements were taken at each time point of rotation at 30°, 45°, and 90° from these 0° reference positions. Note that, for Examples B3 and B4 described below, measurements were taken only at 0°, 45°, and 90°. An angle at which particularly excellent electromagnetic wave shielding properties were confirmed in the evaluation of the electromagnetic wave shielding properties at each of these angles was evaluated as a "maximum performance angle".

The evaluation results of the characteristics described above are shown in Table 1 and FIGS. 17 to 20.

The electromagnetic wave shielding properties in Table 1 indicate a numerical value (maximum value of a peak) of electromagnetic wave shielding performance at a particularly large peak among peaks indicating improvement of shielding performance in a frequency range excluding a noise band on a low frequency side. Furthermore, a frequency indicated in parentheses in Table 1 indicates a frequency at which the maximum value of the peak was observed. For reflectance and absorptance as well, numerical values at the frequency at which the maximum value of the peak was observed were adopted. Note that the numerical values of the electromagnetic wave shielding performance shown in Table 1 are those measured at the maximum performance angle. When there were a plurality of maximum performance angles, the numerical value is that measured at one of those angles. Further, in the measurement at the selected maximum performance angle, except for a noise portion in a low frequency region (0.1 THz or less), a value at which the numerical value of the shielding performance was the lowest is entered in the electromagnetic wave shielding performance column in Table 1, a value at which the numerical value of the reflectance was the highest is entered in the reflectance column in Table 1, and a value at which the numerical value of the absorptance was the lowest is entered in the absorptance column in Table 1. The same applies to Tables 2 and 3 described below. In the terahertz time domain spectroscopy employed in the present embodiment, noise is generated at 0.1 THz (100 GHz) or less, and particularly intense noise is generated at 0.05 THz (50 GHz) or less.

The parameters represented by each symbol in Table 1 are indicated below. These definitions also apply to Tables 2 and 3 described below.

Do: Average value of the lengths of the largest possible line segment in the plane of each conductive material in the circumferential direction P: Pitch width of the conductive material layered portion (also expressed as a distance between the centers of adjacent conductive material layered portions; the pitch widths in both the X direction and the Y direction are the same)

W: Average value of the line widths of the substantially C-like shape in the plane of each conductive material in the circumferential direction Hc: Average value of the thickness of one conductive material Hr: Average value of the thickness of the insulating layer in one layer-forming sheet θc: Average value of the opening angles of the substantially C-like shapes of the conductive materials $\theta_1$ and $\theta_1$': Angles formed between each opening direction of the substantially C-like shape of the conductive material and an opening direction of the substantially C-like shape of a conductive material serving as a reference, as viewed from above in the thickness direction of the sheet, in each row of the conductive materials formed in the X direction and the Y direction, respectively, given the conductive material at one of the two ends of the row as the reference ("-" in Table 1 indicates that the orientations of the opening directions of the substantially C-like shapes in each layer-forming sheet are aligned)

$\theta_2$: Angle formed between the opening direction of the substantially C-like shape of the conductive material and an opening direction of the substantially C-like shape of the conductive material serving as a reference, as viewed from above in the thickness direction of the sheet, in each conductive material layered portion ("–" in Table 1 indicates that the orientations of the opening directions of the substantially C-like shapes in each conductive material layered portion are aligned)

condition that "each of the plurality of layer-forming sheets is independently formed of only a plurality of the specific regions A satisfying the following Condition 1b2 and Condition 2b2," and the Condition 8b1 described above was changed to the following Condition 6b2 and Condition 7b2. The number of the specific regions A present in the sheet was set to 3 (X direction)×3 (Y direction).

Condition 1b2: In each row of the conductive materials formed in the X direction in the specific region A, given the conductive material at one of the two ends of the row as a reference, $360°/\theta_1$ conductive materials are disposed with angles formed between each opening direction of the substantially C-like shape of the conductive material and an opening direction of the substantially C-like shape of the conductive material serving as the reference, as viewed from above in the thickness direction of the sheet, increasing in increments of 120° ($\theta_1$) toward the conductive material at the other end.

TABLE 1

| | Do µm | P mm | W µm | Hc µm | Hr µm | θc ° | $\theta_1$ ° | $\theta_2$ ° | Electromagnetic wave shielding performance dB | Reflectance % | Absorptance % | Maximum Performance angle ° |
|---|---|---|---|---|---|---|---|---|---|---|---|---|
| Example A1 | 300 | 1 | 40 | 9 | 66 | 38 | — | 120 | −25 (195 GHz) | 40 | 59.68 | 0 |
| Example A2 | 300 | 0.75 | 40 | 9 | 66 | 38 | — | 120 | −25 (205 GHz) | 40 | 59.68 | 0 |
| Example A3 | 300 | 0.5 | 40 | 9 | 66 | 38 | — | 120 | −40 (0°) (300 GHz) −40 (90°) (300 GHz) | 5 (0°) 75 (90°) | 94.99 (0°) 24.99 (90°) | 0 90 |
| Example A4 | 300 | 0.5 | 40 | 9 | 66 | 38 | 120 | 120 | −20 (300 GHz) | 20 or less | 80 or more | 0 30 45 90 |

Test 2

Example B1 (X Direction, Y Direction: No Rotation, Thickness Direction: No Rotation)

A sheet was prepared in the same manner as in Example A1, except that the values of the parameters related to the conductive materials were changed to the values of the parameters shown in Table 2, and the condition of the arrangement of the conductive materials that "all conductive material layered portions included in the sheet satisfy the following Condition 6a1 and Condition 7a1" was changed to the condition that "all conductive material layered portions included in the sheet satisfy the following Condition 8b1".

Condition 8b1: The opening directions of the substantially C-like shapes of all conductive materials constituting one conductive material layered portion, as viewed from above in the thickness direction of the sheet, are the same.

Further, the number of conductive materials included in the conductive material layered portion was 16. Specifically, for each conductive material layered portion, the conductive materials were arranged with the respective opening directions of the substantially C-like shapes of the conductive materials from the conductive material on one end to the conductive material on the other end being 0°, 0°, 0°, 0°, 0°, 0°, 0°, 0°, 0°, 0°, 0°, 0°, 0°, 0°, 0°, and 0°.

Example B2 (X Direction, Y Direction: Rotation, Thickness Direction: Rotation)

Regarding the conditions for the arrangement of the conductive materials, a sheet was prepared in the same manner as in Example B1, except that the condition that "each of the plurality of layer-forming sheets independently satisfies the following Condition 5a1" was changed to the Condition 2b2: In each row of the conductive materials formed in the Y direction in the specific region A, given the conductive material at one of the two ends of the row as a reference, $360°/\theta_1'$ conductive materials are disposed with angles formed between each opening direction of the substantially C-like shape of the conductive material and an opening direction of the substantially C-like shape of the conductive material serving as the reference, as viewed from above in the thickness direction of the sheet, increasing in increments of 120° ($\theta_1'$) toward the conductive material at the other end.

Condition 6b2: The conductive material layered portion includes a reference conductive material that is one of the two conductive materials disposed on the uppermost surface side and the lowermost surface side of the sheet and, given 120° ($\theta_2$) as an angle formed between the opening direction of the substantially C-like shape of the conductive material and the opening direction of the substantially C-like shape of the reference conductive material as viewed from above in the thickness direction of the sheet, each conductive material layered portion includes five conductive materials in which the opening directions of the substantially C-like shapes each satisfy $m \times \theta_2$ for each natural number m less than or equal to d satisfying the following Condition 7b2:

Condition 7b2: d in the Condition 6b2 described above satisfies "$(360°/\theta_2)=d$ (where d is a natural number other than 1)".

Specifically, for each conductive material layered portion, the conductive materials were arranged with the respective opening directions of the substantially C-like shapes of the conductive materials from the reference conductive material to the conductive material positioned at the end portion of the conductive material layered portion on a side opposite to the reference conductive material being 0° (reference conductive material), 120°, 240°, 360°, 120°, 240°, 360°, 120°, 240°, 360°, 120°, 240°, 360°, 120°, 240°, and 360°.

Example B3 (X Direction, Y Direction: No Rotation, Thickness Direction: Rotation)

Quadrangular epoxy resin films, each including a surface having a quadrangular shape of 40 mm vertically (referred to as an X direction) and 40 mm horizontally (referred to as a Y direction; a direction orthogonal to the X direction), having a thickness shown in Table 2, and containing an insulating filler, were prepared. This filler has insulating properties, and therefore can be treated substantially the same as an epoxy resin from the viewpoint of characteristics such as shielding performance described below.

Subsequently, copper foil having a thickness of He shown in Table 2 was thermally pressed to both surfaces of the film using an inkjet printer. Subsequently, a hole (via) was formed with a drill, penetrating end portions of the substantially C-like shapes in the layer-forming sheet finally obtained, and the hole was filled with copper. Subsequently, a plurality of layer-forming sheets were prepared. Each layer-forming sheet was prepared by laminating a photosensitive resist on the layers of copper foil on both surfaces of the film, etching by light exposure using an exposure device, and then peeling off the photosensitive resist. Thus, the final conductive materials, each having a substantially C-like shape, were arranged at equal intervals in both a longitudinal direction (the same direction as the X direction described above) and a lateral direction (the same direction as the Y direction described above), forming a quadrangular arrangement on the whole, and the arrangement conditions of the conductive materials of the sheet finally obtained satisfied the arrangement conditions of the conductive materials. The number of the conductive materials present in the sheet was 78 (X direction)×78 (Y direction) per copper foil on one side. Table 2 shows the specific arrangement conditions of the conductive materials. The alignment pitch in Table 2 refers to the distance between the centers of, among the conductive materials arranged in the X direction, the conductive materials adjacent to each other, and refers to the distance between the centers of, among the conductive materials arranged in the Y direction, conductive materials adjacent to each other (the distances between the centers of the conductive materials adjacent to each other are the same in the X direction and the Y direction). Note that the conductive materials having substantially C-like shapes were disposed with a quadrangular shape formed by arranging the conductive materials having substantially C-like shapes side by side and the center of the epoxy resin film in alignment.

Further, using the following method, a sheet was prepared in which the layer-forming sheets were layered, forming a conductive material layered portions by the conductive materials having substantially C-like shapes in each layer-forming sheet, and arranging the conductive materials having pillar shapes at the end portions of the conductive materials having substantially C-like shapes in other sheets adjacently layered thereto, as illustrated in FIG. 13.

Both surfaces of the obtained layer-forming sheets were treated as follows.

The front surface of the layer-forming sheet obtained was subjected to general blackening treatment (treatment of degreasing, soft etching, washing with an acid, and blackening). Subsequently, the layer-forming sheet, a layer made of the same resin as the epoxy resin described above, and copper foil were pressed and thus layered in this order using a welding layup machine. Subsequently, a hole (via) was formed by a drill, penetrating an end portion of each substantially C-like shape present on the outermost surface before the layering and an end portion of each substantially C-like shape present on the outermost surface after the layering, and a process of filling the hole with copper was performed.

Subsequently, the copper foil was etched by light exposure using a method similar to that in the preparation of the layer-forming sheet described above, and conductive materials having substantially C-like shapes were formed. Furthermore, the processing from the blackening treatment to the filling of hole with copper after drilling was repeated until the final number of layers of the conductive materials was 16 (that is, the processing from the blackening treatment to the etching of the copper foil by light exposure was repeated seven times for each of both surfaces of the first layer-forming sheet to manufacture a sheet). Note that, the drilling in a case of three or more layer-forming sheets was performed by penetrating the end portions of the substantially C-like shapes of the two layers of the conductive materials most recently layered at the time of drilling. In this sheet, the arrangement of each conductive material constituting one conductive material layered portion was made uniform in the thickness direction of the sheet, as illustrated in FIG. 4.

With regard to the arrangement of the conductive materials, a sheet was prepared in the same manner as in Example B1, except that Condition 8b1 described above was changed to the following Condition 6b3 and Condition 7b3:

Condition 6b3: The conductive material layered portion includes a reference conductive material that is one of the two conductive materials disposed on the uppermost surface side and the lowermost surface side of the sheet and, given 72° ($\theta_2$) as an angle formed between the opening direction of the substantially C-like shape of the conductive material and the opening direction of the substantially C-like shape of the reference conductive material as viewed from above in the thickness direction of the sheet, each conductive material layered portion includes three conductive materials in which the opening directions of the substantially C-like shapes each satisfy $m\times\theta_2$ for each natural number m less than or equal to d satisfying the following Condition 7b3:

Condition 7b3: d in the Condition 6b3 described above satisfies "$(360°/\theta_2)=d$ (where d is a natural number other than 1)".

Specifically, for each conductive material layered portion, the conductive materials were arranged with the respective opening directions of the substantially C-like shapes of the conductive materials from the reference conductive material to the conductive material positioned at the end portion of the conductive material layered portion on a side opposite to the reference conductive material being 0° (reference conductive material), 72°, 144°, 216°, 288°, 360°, 72°, 144°, 216°, 288°, 360°, 72°, 144°, 216°, 288°, and 360°.

Example B4 (X Direction, Y Direction: No Rotation, Thickness Direction: Rotation)

A sheet was prepared in the same manner as in Example B1, except that Condition 8b1 described above was changed to the following Condition 6b4 and Condition 7b4:

Condition 6b4: The conductive material layered portion includes a reference conductive material that is one of the two conductive materials disposed on the uppermost surface side and the lowermost surface side of the sheet and, given 120° (02) as an angle formed between the opening direction of the substantially C-like shape of the conductive material and the opening direction of the substantially C-like shape of the reference conductive material as viewed from above in the thickness direction of the sheet, each conductive material layered portion includes five conductive materials in which the opening directions of the substantially C-like shapes each satisfy $m \times \theta_2$ for each natural number m less than or equal to d satisfying the following Condition 6 Condition 7b4:

Condition 7b4: d in the Condition 6b4 described above satisfies "$(360°/\theta_2)=d$ (where d is a natural number other than 1)".

Specifically, for each conductive material layered portion, the conductive materials were arranged with the respective opening directions of the substantially C-like shapes of the conductive materials from the reference conductive material to the conductive material positioned at the end portion of the conductive material layered portion on a side opposite to the reference conductive material being 0° (reference conductive material), 120°, 240°, 360°, 120°, 240°, 360°, 120°, 240°, 360°, 120°, 240°, 360°, 120°, 240°, and 360°.

[Evaluation of Characteristics]

(Electromagnetic Wave Shielding Properties)

The electromagnetic wave shielding properties were evaluated by the same method as in Example A1 described above. The evaluation results of the characteristics of each sheet are shown in Table 2 and FIGS. 21 to 24.

Table 2 shows that electromagnetic wave shielding performance can be obtained even when the size of the substantially C-like shape is increased.

In addition, it was also found that the sheet according to Example B2 produced results similar to those of Example A4.

In addition, the sheet according to Example B3 can obtain electromagnetic wave shielding performance without being affected by the sheet rotation angle, but the absorptance was found to be low.

In addition, it was found that the sheet according to Example B4 can obtain electromagnetic wave shielding performance without being affected by the sheet rotation angle, but can obtain a high absorptance especially when the sheet rotation angle is 30°.

Test 3

Comparative Example 1 (No Conductive Material)

A sheet was prepared in the same manner as in Example A1, except that no conductive material was used.

Figure 25:
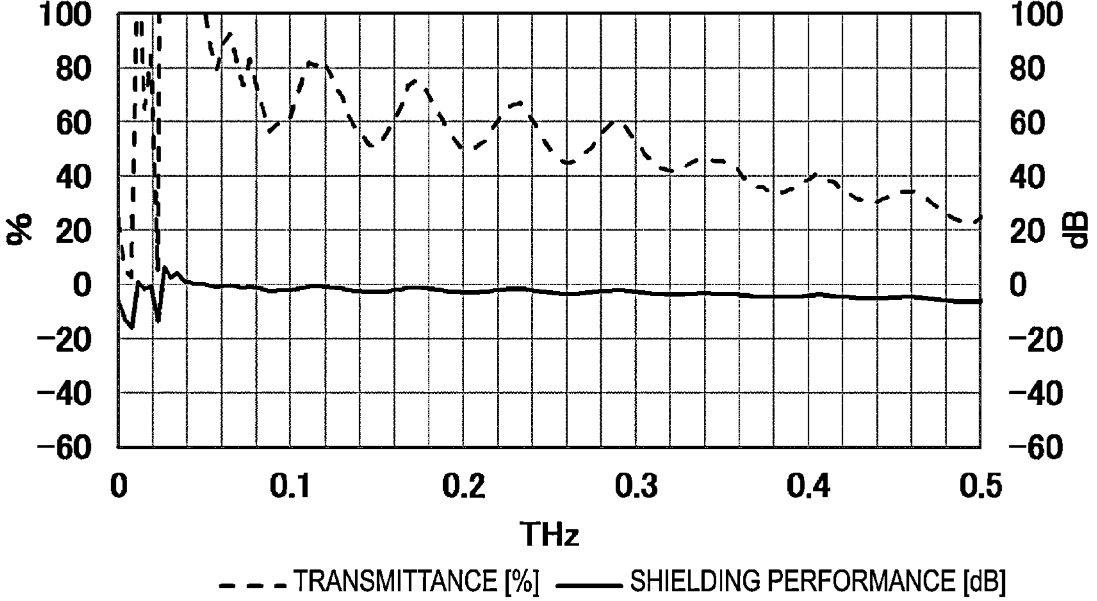
FIG. 25 is a diagram showing results of evaluation of characteristics of a sheet of Comparative Example 1.

The electromagnetic wave shielding properties were evaluated by the same method as in Example A1 described above. The evaluation results of the characteristics of the sheet are shown in FIG. 25. In Comparative Example 1, only the power transmittance T (ω) and the electromagnetic wave shielding performance L (dB) were evaluated. In this comparative example, the electromagnetic waves were vertically incident on the sheet front surface, and the transmittance was measured without rotating the sheet.

FIG. 25 shows that the sheet of Comparative Example 1 had high transmittance and poor shielding performance.

TABLE 2

| | Do µm | P mm | W µm | Hc µm | Hr µm | θc ° | $\theta_1$ ° | $\theta_2$ ° | Electromagnetic wave shielding performance dB | Reflectance % | Absorptance % | Maximum performance angle ° |
|---|---|---|---|---|---|---|---|---|---|---|---|---|
| Example B1 | 600 | 1.25 | 80 | 18 | 67 | 38 | — | — | −30 (104 GHz) | 6.30 | 93.6 | 0 |
| Example B2 | 600 | 1.25 | 80 | 18 | 67 | 38 | 120 | 120 | −15 (104 GHz) | 10 | 86.84 | 0<br>30<br>45<br>90 |
| Example B3 (*1) | 600 | 1.25 | 80 | 18 | 67 | 38 | — | 72 | −35 (104 GHz) | 50 | 49.97 | 0<br>45<br>90 |
| Example B4 | 600 | 1.25 | 80 | 18 | 67 | 38 | — | 72 | −40 (104 GHz) | 1 | 98.99 | 45 |

(*1) Conductive materials having pillar shape are present

Table 1 shows that high electromagnetic wave shielding performance can be obtained with the sheets according to Examples A1 to A3, although the performance is affected by the sheet rotation angle. Note that, for Example A1, the present inventor also conducted tests at a sheet rotation angle of 180°, which was confirmed by the inventor to be the maximum performance angle.

In addition, with the sheet according to Example A3, it was revealed that a higher absorptance is achieved when the sheet rotation angle was 0°.

In addition, it was found that the sheet according to Example A4 can obtain electromagnetic wave shielding performance without being affected by the sheet rotation angle, but the absorptance was high.

Test 4

Example C1 (X Direction, Y Direction: Rotation, Thickness Direction: Rotation)

A sheet was prepared in the same manner as in Example A1 and, regarding the conditions for the arrangement of the conductive materials, the values of the parameters of the conductive materials were changed to the values of the parameters shown in Table 3, the condition that "each of the plurality of layer-forming sheets independently satisfies Condition 5a1" was changed to the condition that "each of the plurality of layer-forming sheets is independently formed of only a plurality of the specific regions A satisfying Condition 1c1 and Condition 2c1," the condition that "all conductive material layered portions included in the sheet satisfy Condition 6a1 and Condition 7a1" was changed to the condition that "all conductive material layered portions included in the sheet satisfy Condition 5c1 and Condition 6c1," and the arrangement of the conductive materials constituting one conductive material layered portion was made uniform in the thickness direction of the sheet as illustrated in FIG. 4.

Condition 1c1: In each row of the conductive materials formed in the X direction in the specific region A, given the conductive material at one of the two ends of the row as a reference, $360°/\theta_1$ conductive materials are disposed with angles formed between each opening direction of the substantially C-like shape of the conductive material and an opening direction of the substantially C-like shape of the conductive material serving as the reference, as viewed from above in the thickness direction of the sheet, increasing in increments of 120° ($\theta_1$) toward the conductive material at the other end.

Condition 2c1: In each row of the conductive materials formed in the Y direction in the specific region A, given the conductive material at one of the two ends of the row as a reference, $360°/\theta_1'$ conductive materials are disposed with angles formed between each opening direction of the substantially C-like shape of the conductive material and an opening direction of the substantially C-like shape of the conductive material serving as the reference, as viewed from above in the thickness direction of the sheet, increasing in increments of 120° ($\theta_1'$) toward the conductive material at the other end.

Condition 6c1: The conductive material layered portion includes a reference conductive material that is one of the two conductive materials disposed on the uppermost surface side and the lowermost surface side of the sheet and, given 120° ($\theta_2$) as an angle formed between the opening direction of the substantially C-like shape of the conductive material and the opening direction of the substantially C-like shape of the reference conductive material as viewed from above in the thickness direction of the sheet, each conductive material layered portion includes five conductive materials in which the opening directions of the substantially C-like shapes each satisfy $m\times\theta_2$ for each natural number m less than or equal to d satisfying the following Condition 7c1:

Condition 7c1: d in the Condition 6c1 described above satisfies "$(360°/\theta_2)=d$ (where d is a natural number other than 1)".

Specifically, for each conductive material layered portion, the conductive materials were arranged with the respective opening directions of the substantially C-like shapes of the conductive materials from the reference conductive material to the conductive material positioned at the end portion of the conductive material layered portion on a side opposite to the reference conductive material being 0° (reference conductive material), 120°, 240°, 360°, 120°, 240°, 360°, 120°, 240°, 360°, 120°, 240°, 360°, 120°, 240°, and 360°.

Example C2 (X Direction, Y Direction: Rotation, Thickness Direction: Rotation)

A sheet was prepared in the same manner as in Example C1, except that the values of the parameters related to the conductive materials were changed to the values of the parameters shown in Table 3.

Example C3 (X Direction, Y Direction: Rotation, Thickness Direction: Rotation)

A sheet was prepared in the same manner as in Example C1, except that, in Condition 6c1, the conductive material positioned at the end portion of the conductive material layered portion on the side opposite to the reference conductive material was not used.

For each conductive material layered portion, the conductive materials were arranged with the respective opening directions of the substantially C-like shapes of the conductive materials from the reference conductive material to the conductive material positioned at the end portion of the conductive material layered portion on a side opposite to the reference conductive material being 0° (reference conductive material), 120°, 240°, 360°, 120°, 240°, 360°, 120°, 240°, 360°, 120°, 240°, 360°, 120°, and 240°.

Example C4 (X Direction, Y Direction: Rotation, Thickness Direction: Rotation)

A sheet was prepared in the same manner as in Example C1, except that the condition that "all conductive material layered portions included in the sheet satisfy the following Condition 6c1 and Condition 7c1" was changed to the condition that "all conductive material layered portions included in the sheet satisfy the following Condition 6c4 and Condition 7c4":

Condition 6c4: The conductive material layered portion includes a reference conductive material that is one of the two conductive materials disposed on the uppermost surface side and the lowermost surface side of the sheet and, given 120° ($\theta_2$) as an angle formed between the opening direction of the substantially C-like shape of the conductive material and the opening direction of the substantially C-like shape of the reference conductive material as viewed from above in the thickness direction of the sheet, each conductive material layered portion includes one conductive material in which the opening directions of the substantially C-like shapes each satisfy $m\times\theta_2$ for each natural number m less than or equal to d satisfying the following Condition 7c4:

Condition 7c4: d in the Condition 6c4 described above satisfies "$(360°/\theta_2)=d$ (where d is a natural number other than 1)".

Specifically, for each conductive material layered portion, the conductive materials were arranged with the respective opening directions of the substantially C-like shapes of the conductive materials from the reference conductive material to the conductive material positioned at the end portion of the conductive material layered portion on a side opposite to the reference conductive material being 0° (reference conductive material), 120°, 240°, and 360°.

Example C5 (X Direction, Y Direction: Rotation, Thickness Direction: Rotation)

A sheet was prepared in the same manner as in Example C1, except that the condition that "all conductive material layered portions included in the sheet satisfy the following Condition 6c1 and Condition 7c1" was changed to the condition that "all conductive material layered portions included in the sheet satisfy the following Condition 6c5 and Condition 7c5".

Condition 6c5: The conductive material layered portion includes a reference conductive material that is one of the two conductive materials disposed on the uppermost surface side and the lowermost surface side of the sheet and, given 24° ($\theta_2$) as an angle formed between the opening direction of the substantially C-like shape of the conductive material and the opening direction of the substantially C-like shape of the reference conductive material as viewed from above in the thickness direction of the sheet, each conductive material layered portion includes one conductive material in which the opening directions of the substantially C-like shapes each satisfy $m \times \theta_2$ for each natural number m less than or equal to d satisfying the following Condition 7c5:

Condition 7c5: d in the Condition 6c5 described above satisfies "$(360°/\theta_2)=d$ (where d is a natural number other than 1)".

Further, for each conductive material layered portion, the conductive materials were arranged with the respective opening directions of the substantially C-like shapes of the conductive materials from the reference conductive material to the conductive material positioned at the end portion of the conductive material layered portion on a side opposite to the reference conductive material being 0° (reference conductive material), 24°, 48°, 72°, 96°, 120°, 144°, 168°, 192°, 216°, 240°, 264°, 288°, 312°, 336° and 360°.

Example C6 (X Direction, Y Direction: Rotation, Thickness Direction: Rotation)

A sheet was prepared in the same manner as in Example C1, except that, for each conductive material layered portion, the conductive materials were arranged with the respective opening directions of the substantially C-like shapes of the conductive materials from the reference conductive material to the conductive material positioned at the end portion of the conductive material layered portion on a side opposite to the reference conductive material being 0° (reference conductive material), 360°, 360°, 360°, 360°, 360°, 360°, 120°, 120°, 120°, 120°, 120°, 240°, 240°, 240°. 240°, and 240°.

Example C7 (X Direction, Y Direction: Rotation, Thickness Direction: Rotation)

A sheet was prepared in the same manner as in Example C1, except that the condition that "all conductive material layered portions included in the sheet satisfy the following Condition 6c1 and Condition 7c1" was changed to the condition that "all conductive material layered portions included in the sheet satisfy the following Condition 6c7 and Condition 7c7".

Condition 6c7: The conductive material layered portion includes a reference conductive material that is one of the two conductive materials disposed on the uppermost surface side and the lowermost surface side of the sheet and, given 180° ($\theta_2$) as an angle formed between the opening direction of the substantially C-like shape of the conductive material and the opening direction of the substantially C-like shape of the reference conductive material as viewed from above in the thickness direction of the sheet, each conductive material layered portion includes seven conductive materials in which the opening directions of the substantially C-like shapes each satisfy $m \times \theta_2$ for each natural number m less than or equal to d satisfying the following Condition 7c7, and the conductivity of $\theta_2=180°$ was provided at the end portion of the conductive material layered portion on the side opposite to the reference conductive material:

Condition 7c7: d in Condition 6c7 described above satisfies "$(360°/\theta_2)=d$ (where d is a natural number other than 1)".

Specifically, for each conductive material layered portion, the conductive materials were arranged with the respective opening directions of the substantially C-like shapes of the conductive materials from the reference conductive material to the conductive material positioned at the end portion of the conductive material layered portion on a side opposite to the reference conductive material being 0° (reference conductive material), 180°, 360°, 180°, 360°, 180°, 360°, 180°, 360°, 180°, 360°, 180°, 360°, 180°, 360°, and 180°.

Example C8 (X Direction, Y Direction: Rotation, Thickness Direction: No Rotation)

A sheet was prepared in the same manner as in Example C1, except that the condition that "all conductive material layered portions included in the sheet satisfy the following Condition 6c1 and Condition 7c1" was changed to the condition that "all conductive material layered portions included in the sheet satisfy the following Condition 8c8".

Condition 8c8: The opening directions of the substantially C-like shapes of all conductive materials constituting one conductive material layered portion, as viewed from above in the thickness direction of the sheet, are the same.

Further, the number of conductive materials included in the conductive material layered portion was 16. Specifically, for each conductive material layered portion, the conductive materials were arranged with the respective opening directions of the substantially C-like shapes of the conductive materials from the conductive material on one end to the conductive material on the other end being 00, 00, 00, 00, 00, 00, 00, 00, 00, 00, 00, 00, 00, 00, 00, and 00.

Example C9 (X Direction: Rotation, Y Direction: No Rotation, Thickness Direction: No Rotation)

A sheet was prepared in the same manner as in Example C8, except that the condition that "each of the plurality of layer-forming sheets is independently formed of only a plurality of the specific regions A that satisfy the following Condition 1c1 and Condition 2c1" was changed to the condition that "each of the plurality of layer-forming sheets is independently formed of only a plurality of the specific regions A that satisfy the following Condition 1c1 and Condition 2c9".

Condition 2c9: In each row of the conductive materials formed in the Y direction in the specific region A, the conductive materials are disposed with opening directions of the substantially C-like shapes of all conductive materials constituting the row as viewed from above in the thickness direction of the sheet being the same.

Example C10 (X Direction: Rotation, Y Direction: No Rotation, Thickness Direction: Rotation)

A sheet was prepared in the same manner as in Example C9, except that the condition that "all conductive material layered portions included in the sheet satisfy the following Condition 6c1 and Condition 7c1" was changed to the condition that "all conductive material layered portions included in the sheet satisfy the following Condition 6c10 and Condition 7c10".

Condition 6c10: The conductive material layered portion includes a reference conductive material that is one of the two conductive materials disposed on the uppermost surface side and the lowermost surface side of the sheet and, given 12° ($\theta_2$) as an angle formed between the opening direction of the substantially C-like shape of the conductive material and the opening direction of the substantially C-like shape of the reference conductive material as viewed from above in the thickness direction of the sheet, each conductive material layered portion includes five conductive materials in which the opening directions of the substantially C-like shapes each satisfy $m \times \theta_2$ for each natural number m less than or equal to d satisfying the following Condition 7c10:

Condition 7c10: d in the Condition 6c10 described above satisfies "($360°/\theta_2$)=d (where d is a natural number other than 1)".

Specifically, for each conductive material layered portion, the conductive materials were arranged with the respective opening directions of the substantially C-like shapes of the conductive materials from the reference conductive material to the conductive material positioned at the end portion of the conductive material layered portion on a side opposite to the reference conductive material being 0° (reference conductive material), 120°, 240°, 360°, 120°, 240°, 360°, 120°, 240°, 360°, 120°, 240°, 360°, 120°, 240°, and 360°.

Example C11 (X Direction, Y Direction: Rotation, Thickness Direction: Rotation)

A sheet was prepared in the same manner as in Example C1, except that the condition that "all conductive material layered portions included in the sheet satisfy the following Condition 6c1 and Condition 7c1" was changed to the condition that "all conductive material layered portions included in the sheet satisfy the following Condition 6c11 and Condition 7c11".

Condition 6c11: The conductive material layered portion includes a reference conductive material that is one of the two conductive materials disposed on the uppermost surface side and the lowermost surface side of the sheet and, given 72° ($\theta_2$) as an angle formed between the opening direction of the substantially C-like shape of the conductive material and the opening direction of the substantially C-like shape of the reference conductive material as viewed from above in the thickness direction of the sheet, each conductive material layered portion includes three conductive materials in which the opening directions of the substantially C-like shapes each satisfy $m \times \theta_2$ for each natural number m less than or equal to d satisfying the following Condition 7c11:

Condition 7c11: d in the Condition 6c11 described above satisfies "($360°/\theta_2$)=d (where d is a natural number other than 1)".

Specifically, for each conductive material layered portion, the conductive materials were arranged with the respective opening directions of the substantially C-like shapes of the conductive materials from the reference conductive material to the conductive material positioned at the end portion of the conductive material layered portion on a side opposite to the reference conductive material being 0° (reference conductive material), 72°, 144°, 216°, 288°, 360°, 72°, 144°, 216°, 288°, 360°, 72°, 144°, 216°, 288°, and 360°.

[Evaluation of Characteristics]

(Electromagnetic Wave Shielding Properties)

The electromagnetic wave shielding properties were evaluated by the same method as in Example A1 described above. The evaluation results of the characteristics of each sheet are shown in Table 3 and FIGS. 26 to 28. Note that, with regard to the "maximum performance angle,"

Figure 26:
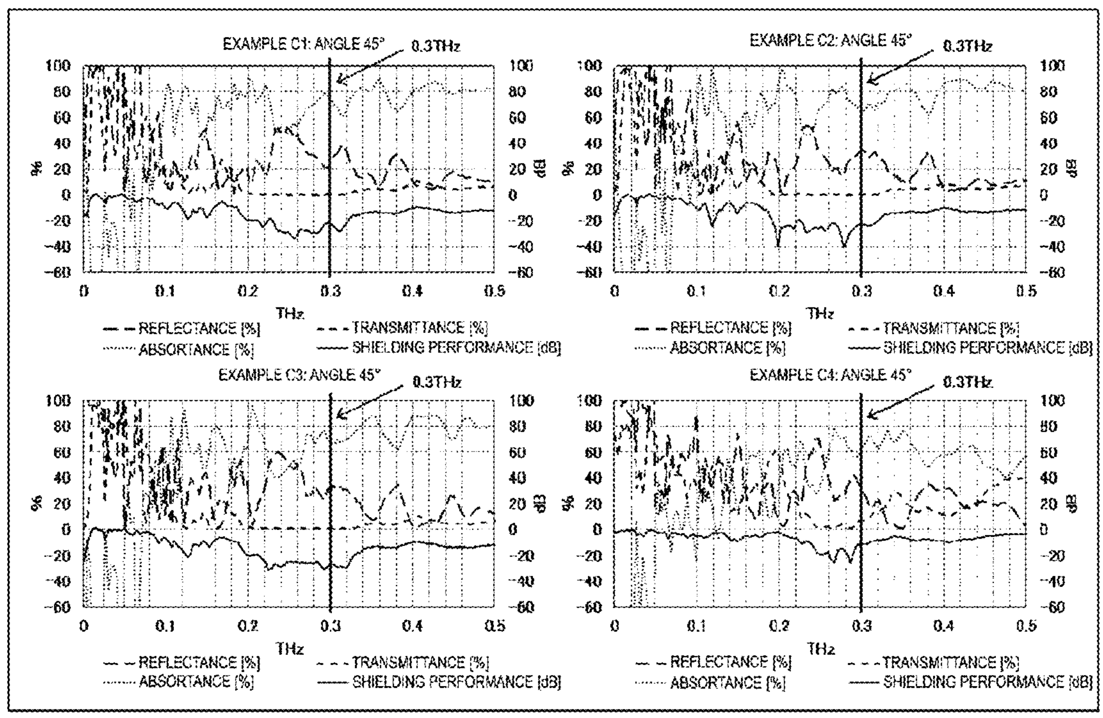
FIG. 26 is a diagram showing results of evaluation of characteristics of the sheets of Examples C1 to C4.
Figure 27:
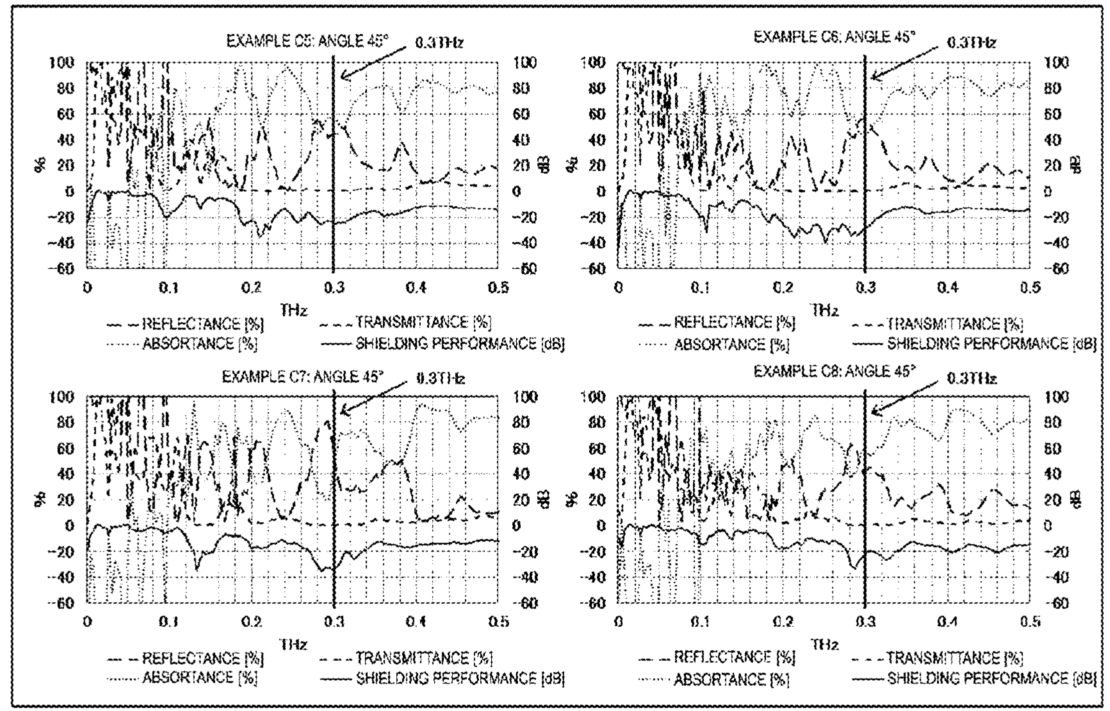
FIG. 27 is a diagram showing results of evaluation of characteristics of the sheets of Examples C5 to C8.
Figure 28:
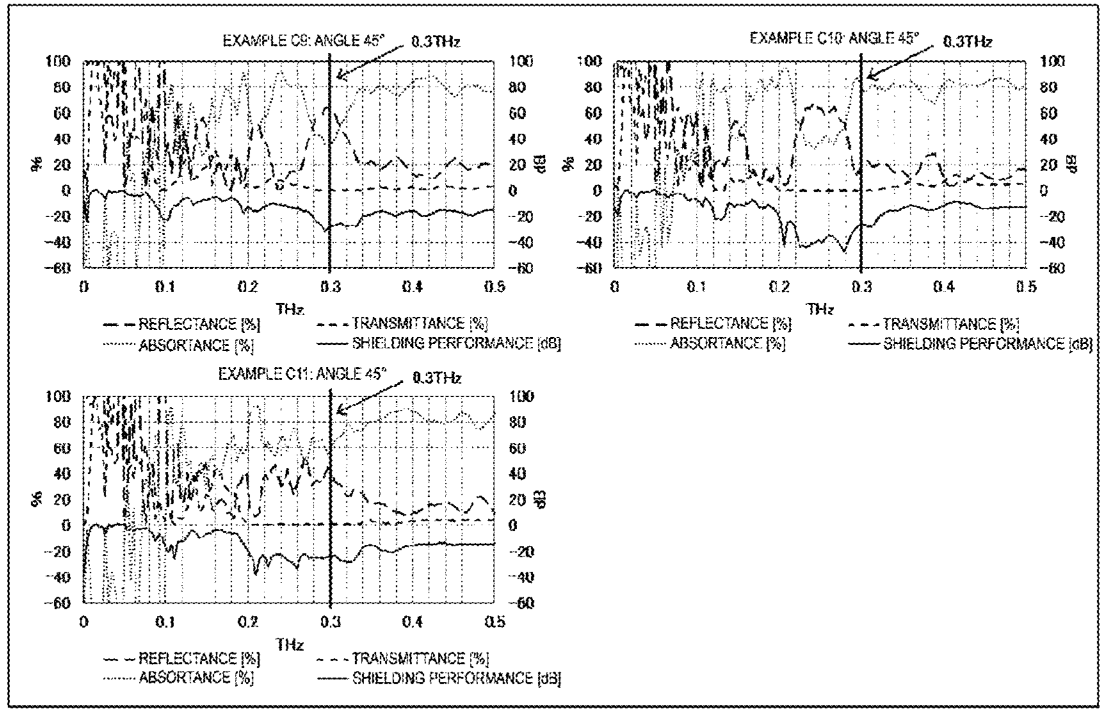
FIG. 28 is a diagram showing results of evaluation of characteristics of the sheets of Examples C9 to C11.

0°, 30°, 45°, and 90° are entered in Table 3 for all examples. However, because similar results were obtained at all angles in each example, only the results of the case of 45° are shown in FIGS. 26 to 28.

In the columns of X-direction rotation, Y-direction rotation, and thickness-direction rotation in Table 3, "R" indicates rotation and "-" indicates no rotation.

TABLE 3

| | Do μm | P mm | W μm | Hc μm | Hr μm | θc ° | $\theta_1$ ° | $\theta_2$ ° | Number of layer-forming sheets — | X-direction rotation — | Y-direction rotation |
|---|---|---|---|---|---|---|---|---|---|---|---|
| Example C1 | 300 | 0.5 | 40 | 5 | 96 | 38 | 120 | 120 | 16 | R | R |
| Example C2 | 300 | 0.5 | 40 | 5 | 96 | 23 | 120 | 120 | 16 | R | R |
| Example C3 | 300 | 0.5 | 40 | 5 | 96 | 38 | 120 | 120 | 15 | R | R |
| Example C4 | 300 | 0.5 | 40 | 5 | 96 | 38 | 120 | 120 | 4 | R | R |
| Example C5 | 300 | 0.5 | 40 | 5 | 96 | 38 | 120 | 24 | 16 | R | R |
| Example C6 | 300 | 0.5 | 40 | 5 | 96 | 38 | 120 | 120 | 16 | R | R |
| Example C7 | 300 | 0.5 | 40 | 5 | 96 | 38 | 120 | 180 | 16 | R | R |
| Example C8 | 300 | 0.5 | 40 | 5 | 96 | 38 | 120 | — | 16 | R | R |
| Example C9 | 300 | 0.5 | 40 | 5 | 96 | 38 | 120 | — | 16 | R | — |
| Example C10 | 300 | 0.5 | 40 | 5 | 96 | 38 | 120 | 120 | 16 | R | — |
| Example C11 | 300 | 0.5 | 40 | 5 | 96 | 38 | 120 | 72 | 16 | R | R |

| | Thickness-direction rotation — | Electromagnetic wave shielding performance dB | Reflectance % | Absorptance % | Maximum Performance angle ° |
|---|---|---|---|---|---|
| Example C1 | R | −20 (300 GHz) | 35 or less | 65 or more | 0<br>30<br>45<br>90 |
| Example C2 | R | −20 (300 GHz) | 40 or less | 60 or more | Same as above |

TABLE 3-continued

| | | | | | |
|---|---|---|---|---|---|
| Example C3 | R | −25 (300 GHz) | 45 or less | 55 or more | Same as above |
| Example C4 | R | −10 (300 GHz) | 45 or less | 55 or more | Same as above |
| Example C5 | R | −20 (300 GHz) | 50 | 50 | Same as above |
| Example C6 | R | −30 (300 GHz) | 60 or less | 40 or more | Same as above |
| Example C7 | R | −30 (300 GHz) | 50 | 50 | Same as above |
| Example C8 | — | −20 (300 GHz) | 50 | 50 | Same as above |
| Example C9 | — | −25 (300 GHz) | 65 or less | 35 or more | Same as above |
| Example C10 | R | −25 (300 GHz) | 20 or less | 80 or more | Same as above |
| Example C11 | R | −20 (300 GHz) | 45 or less | 55 or more | Same as above |

Table 3 shows that the sheets of Examples C1 to C11 can shield electromagnetic waves in a high frequency band.

Further, when the performances in the 300 GHz frequency band were compared, it was found that the sheet of Example C10 was relatively excellent and the sheet of C4 was relatively poor from the viewpoints of electromagnetic wave shielding performance, reflectance, and the absorptance.

In addition, when the influence of the rotation in the XY directions was examined, a comparison between Examples C8 and C9 ($\theta_2$=0°) revealed that no Y rotation is preferable in terms of electromagnetic wave shielding performance, and Y rotation is preferable in terms of reflectance and absorptance. Further, a comparison between Examples C1 and C10 ($\theta_2$=120°) revealed that no Y rotation is preferable in terms of electromagnetic wave shielding performance, and no Y rotation is preferable in terms of reflectance and absorptance. Further, it was found that, in C10, a resonance frequency band appeared in the vicinity of frequencies 250±25 GHz, and a shielding performance of −30 dB was achieved in this frequency band (however, the reflectance was 70% and the absorptance was 30%).

In addition, when the rotation in the thickness direction was examined, a comparison between Examples C1 and C6 ($\theta_2$ is the same) revealed that Example C6 is superior in shielding performance, but has high reflectance and low absorptance. Therefore, it was found that layering is preferably performed while rotating in the thickness direction.

In addition, when the influences of the front and back surfaces of the sheet was examined, a comparison between Example C1 (front and back are the same) and Example C3 (sheet of Example C1 without one frontmost layer; front and back are not the same) revealed that there was no difference in shielding performance, reflectance, and absorptance. In addition to the evaluation described above, measurement was performed on both the front and back surfaces of the sheet in Example C6 only, and it was found that there was no difference in shielding performance, reflectance, and absorptance.

When the influence of the thickness of the sheet was examined, a comparison between Example C1 (16 layers) and Example C4 (four layers) revealed that Example C1 having a thicker sheet is superior in all characteristics of shielding performance, reflectance, and absorptance.

In addition, when the influence of θc was examined, a comparison between Example C1 (38°) and Example C2 (23°) revealed that all characteristics of shielding performance, reflectance, and absorptance were substantially the same even when θc was changed. On the other hand, it was found that the sheet of Example C2 exhibited a resonance frequency band in the vicinity of a frequency of 275 GHz, and achieved a shielding performance of −30 dB, a reflectance of 30%, and an absorptance of 70% in this frequency band. The inventor of the present invention believes that, when θc is decreased, the resonance LC becomes longer, and thus the broad waveform becomes a sharp waveform, and the resonance frequency band appears at 275 GHz which is lower than the 300 GHz band.

Further, when the influence of the thickness Hc of the copper foil was examined, a comparison between the Example C1 (5 μm) and the Example A4 (9 μm) revealed that the shielding performance is the same, but reflectance is lower and absorptance is higher in Example A4 having a thicker Hc (larger copper foil volume).

As described above, according to the present disclosure, it is possible to make smaller and lighter products as compared with those of sheets in the related art that use electromagnetic wave reflective materials using metal plates having a large area, and further provide an electromagnetic wave shield that can block electromagnetic waves in a high frequency band and a manufacturing method thereof.

REFERENCE SIGNS LIST

1 Base material
2 Conductive material having substantially C-like shape
3 Conductive material layered portion
4 Conductive material having pillar shape
10 Sheet
20 Layer-forming sheet
21 Base material

The invention claimed is:

1. A sheet comprising:

an insulating material; and a plurality of conductive materials each having a plate shape and having a substantially C-like shape as viewed from above in a thickness direction of the sheet, wherein each of the plurality of conductive materials is disposed such that a circumferential direction of the substantially C-like shape and a planar direction of the sheet are substantially parallel to each other, wherein at least some of the plurality of conductive materials form a conductive material layered portion in which a plurality of the conductive materials are disposed within the sheet and disposed in the thickness direction of the sheet without being in contact with each other, wherein a plurality of the conductive material layered portions are disposed in the planar direction of the sheet, and wherein the plurality of conductive material layered portions that are disposed in the planar direction of the sheet forms a plurality of rows formed at equal intervals and extending in a certain direction, each of the plurality of conductive material layered portions is disposed with the conductive materials constituting the conductive material layered portion substantially parallel to the planar direction of the sheet, thereby forming a plurality of layers in the planar direction including a plurality of the conductive materials on the same plane, and wherein each layer of the plurality of layers in the planar direction independently includes a specific region A satisfying the following Condition 1:

Condition 1: in each of the plurality of rows of the conductive materials formed extending in the certain direction in the specific region A, given the conductive material at one of two ends of the row as a reference, the conductive materials are disposed with angles respectively formed between an opening direction of the substantially C-like shape of the conductive materials and an opening direction of the substantially C-like shape of the conductive material serving as the reference as viewed from above in the thickness direction of the sheet increasing in increments of $\theta_1$ toward the conductive material at the other end; and the $\theta_1$ satisfies $0° < \theta_1 < 360°$ with a tolerance of less than $\theta_1/2$.

2. The sheet according to claim 1, wherein the number of the plurality of conductive material layered portions disposed in the planar direction of the sheet as viewed from above in the thickness direction of the sheet with respect to an area of the sheet as viewed from above in the thickness direction of the sheet is from 1 portion/$mm^2$ or more and 30 portions/$mm^2$ or less.

3. The sheet according to claim 1, wherein the specific region A further satisfies the following Condition 3A:

Condition 3A: $\theta_1$ satisfies: $(360°/\theta_1)=n$, wherein n is a natural number other than 1.

4. The sheet according to claim 3, wherein the specific region A further satisfies the following Condition 4A:

Condition 4A: the number of the conductive materials included in each of the plurality of rows of the conductive materials formed extending in the certain direction is $360°/\theta_1$.

5. The sheet according to claim 1, wherein the plurality of conductive material layered portions are further disposed in the planar direction of the sheet, forming a plurality of rows formed at equal intervals and extending in a direction orthogonal to the certain direction, and in the specific region A, each layer of the plurality of layers in the planar direction independently satisfies the following Condition 2:

Condition 2: in each of the plurality of rows of the conductive materials formed extending in the direction orthogonal to the certain direction in the specific region A, given the conductive material at one of the two ends of the row as a reference conductive material, the conductive materials are disposed with angles respectively formed between the opening direction of the substantially C-like shape of the conductive materials and the opening direction of the substantially C-like shape of the reference conductive material as viewed from above in the thickness direction of the sheet increasing in increments of $\theta_1'$ toward the conductive material at the other end; and the $\theta_1'$ satisfies $0° < \theta_1' < 360°$ with a tolerance of less than $\theta_1'/2$.

6. The sheet according to claim 5, wherein the specific region A further satisfies the following Condition 3B:

Condition 3B: $\theta_1'$ satisfies: $(360°/\theta_1')=n$, wherein n is a natural number other than 1.

7. The sheet according to claim 6, wherein the specific region A further satisfies the following Condition 4B:

Condition 4B: the number of the conductive materials included in each of the plurality of rows of the conductive materials formed extending in the direction orthogonal to the certain direction is $360°/\theta_1'$.

8. The sheet according to claim 1, wherein the plurality of conductive material layered portions are further disposed in the planar direction of the sheet, forming a plurality of rows formed at equal intervals and extending in a direction orthogonal to the certain direction, and in the specific region A, each layer of the plurality of layers in the planar direction independently satisfies the following Condition 2':

Condition 2': in each of the plurality of rows of the conductive materials formed in the direction orthogonal to the certain direction in the specific region A, the conductive materials are disposed with the opening directions of the substantially C-like shapes of all of the conductive materials constituting the row as viewed from above in the thickness direction of the sheet being the same.

9. The sheet according to claim 1, wherein the plurality of conductive material layered portions are disposed in the planar direction of the sheet at equal intervals in a certain direction and at equal intervals in a direction orthogonal to the certain direction, each of the plurality of conductive material layered portions is disposed with the conductive materials constituting the conductive material layered portion substantially parallel to the planar direction of the sheet, thereby forming a plurality of layers in the planar direction including a plurality of the conductive materials on the same plane, and each layer of the plurality of layers in the planar direction independently includes a specific region B satisfying the following Condition 5:

Condition 5: opening directions of the substantially C-like shapes of all of the conductive materials in the specific region B as viewed from above in the thickness direction of the sheet are the same.

10. The sheet according to claim 1, wherein the one or more conductive material layered portions include at least one specific conductive material layered portion in which opening directions of the substantially C-like shapes of the conductive materials constituting the conductive material layered portion, as viewed from above in the thickness direction of the sheet, differ from each other at least in part.

11. The sheet according to claim 10, wherein the at least one specific conductive material layered portion includes at least one specific conductive material layered portion in which the opening directions of the substantially C-like shapes of, among the conductive materials constituting the specific conductive material layered portion, two conductive materials disposed on an uppermost surface side and a lowermost surface side of the sheet are the same.

12. The sheet according to claim 1, wherein the at least one specific conductive material layered portion includes at least one specific conductive material layered portion satisfying the following Condition 6:

Condition 6: in the at least one specific conductive material layered portion, given one of two conductive materials disposed on an uppermost surface side and a lowermost surface side of the sheet as a reference conductive material and $\theta_2$ as an angle formed between an opening direction of the substantially C-like shape of the conductive materials and an opening direction of the substantially C-like shape of the reference conductive material as viewed from above in the thickness direction of the sheet, the opening direction of the substantially C-like shape of the conductive materials, other than the reference conductive material, included in the specific conductive material layered portion is represented by $m\theta_2$; the m is a natural number; and the $\theta_2$ satisfies $0° < \theta_2 < 360°$ with a tolerance of less than $\theta_2/2$.

13. The sheet according to claim 12, wherein the at least one specific conductive material layered portion includes k (where k is a natural number) conductive materials, each with the m being a natural number of d or less satisfying the following Condition 7 and the opening direction of the substantially C-like shape satisfying $m\theta_2$:

Condition 7: d satisfies: $(360°/\theta_2) = d$, wherein d is a natural number other than 1.

14. The sheet according to claim 1, wherein the one or more conductive material layered portions includes at least one conductive material layered portion in which opening directions of the substantially C-like shapes of all of the conductive materials constituting the conductive material layered portion, as viewed from above in the thickness direction of the sheet, are the same.

15. The sheet according to claim 1, wherein an average value of lengths of largest possible line segments in a plane of each of the plurality of conductive materials in the circumferential direction is from 1 μm or more and 2000 μm or less.

16. The sheet according to claim 1, wherein an average value of distances between the plurality of conductive materials in the thickness direction of the sheet is from 1 μm or more and 3000 μm or less.

17. The sheet according to claim 1, wherein the one or more conductive material layered portions includes at least one conductive material layered portion including a conductive material having a pillar shape that connects each of the conductive materials constituting the conductive material layered portion to another conductive material disposed adjacently in the thickness direction.

18. The sheet according to claim 1, wherein the conductive materials constituting each of the one or more conductive material layered portions are not electrically continuous with each other.

* * * * *